United States Patent
Taniguchi et al.

(10) Patent No.: US 8,179,033 B2
(45) Date of Patent: May 15, 2012

(54) DISPLAY APPARATUS

(75) Inventors: Reiko Taniguchi, Osaka (JP); Masayuki Ono, Osaka (JP); Shogo Nasu, Hyogo (JP); Eiichi Satoh, Osaka (JP); Toshiyuki Aoyama, Osaka (JP); Kenji Hasegawa, Osaka (JP); Masaru Odagiri, Hyogo (JP); Masato Murayama, Osaka (JP)

(73) Assignee: Panasonic Corporation, Osaka (JP)

( * ) Notice: Subject to any disclaimer, the term of this patent is extended or adjusted under 35 U.S.C. 154(b) by 651 days.

(21) Appl. No.: 12/439,753

(22) PCT Filed: Sep. 12, 2007

(86) PCT No.: PCT/JP2007/067729
§ 371 (c)(1),
(2), (4) Date: Mar. 3, 2009

(87) PCT Pub. No.: WO2008/032737
PCT Pub. Date: Mar. 20, 2008

(65) Prior Publication Data
US 2010/0188319 A1 Jul. 29, 2010

(30) Foreign Application Priority Data

Sep. 14, 2006 (JP) .................................. 2006-248950
Sep. 14, 2006 (JP) .................................. 2006-248951

(51) Int. Cl.
*H05B 33/00* (2006.01)
(52) U.S. Cl. ........................................ 313/503; 313/497
(58) Field of Classification Search .................. None
See application file for complete search history.

(56) References Cited

U.S. PATENT DOCUMENTS

| 2006/0091789 A1 | 5/2006 | Aoyama et al. |
| 2007/0090358 A1 | 4/2007 | Kanno et al. |
| 2008/0191607 A1 | 8/2008 | Kawai et al. |
| 2008/0291140 A1* | 11/2008 | Kent et al. ........................ 345/83 |

(Continued)

FOREIGN PATENT DOCUMENTS

JP    62-254394    11/1987

(Continued)

OTHER PUBLICATIONS

International Preliminary Report on Patentability and Written Opinion of the International Searching Authority, issued in corresponding International Patent Application No. PCT/JP2007/067729, dated Mar. 26, 2009.

*Primary Examiner* — Ashok Patel
(74) *Attorney, Agent, or Firm* — McDermott Will & Emery LLP

(57) ABSTRACT

A display is provided with: a substrate; a plurality of parallel scan wires extending over the substrate in a first direction; a plurality of parallel data wires extending parallel to a surface of the substrate in a second direction perpendicular to the first direction; at least one switching element per intersection between the scan wires and the data wires; pixel electrodes connected to the switching elements; at least one phosphor layer provided above the pixel electrodes; and common electrodes provided above the phosphor layer, and the phosphor layer has a polycrystalline structure made of a first semiconductor material and a second semiconductor material segregated between grain boundaries in the polycrystalline structure, which is different from the first semiconductor material.

21 Claims, 13 Drawing Sheets

U.S. PATENT DOCUMENTS

2010/0308719 A1* 12/2010 Ray et al. .................. 313/509

FOREIGN PATENT DOCUMENTS

| | | |
|---|---|---|
| JP | 7-44072 | 5/1995 |
| JP | 7-216351 | 8/1995 |
| JP | 2000-133463 | 5/2000 |
| JP | 2000-188181 | 7/2000 |
| JP | 2005-167229 | 6/2005 |
| JP | 2005-187806 | 7/2005 |
| JP | 3741157 | 11/2005 |
| JP | 2006-127884 | 5/2006 |
| WO | WO 03/020848 A1 | 3/2003 |
| WO | WO 2006/025259 | 8/2005 |

* cited by examiner

DISPLAY APPARATUS

RELATED APPLICATIONS

This application is the U.S. National Phase under 35 U.S.C. §371 of International Application No. PCT/JP2007/067729, filed on Sep. 12, 2007, which in turn claims the benefit of Japanese Application Nos. 2006-248950, filed Sep. 14, 2006 and 2006-248951, filed Sep. 14, 2006, the disclosures of which Applications are incorporated by reference herein.

BACKGROUND OF THE INVENTION

1. Technical Field

The present invention relates to a display using electroluminescence (hereinafter abbreviated to EL) elements, and in particular, to an active matrix display.

2. Background Art

In recent years, electroluminescence elements (hereinafter referred to as EL elements) have been drawing attention as light and thin surface light emitting elements. EL elements can be generally categorized into organic EL elements, which emit light when a direct current voltage is applied to a fluorescent material made of an organic material so as to recombine electrons and holes, and inorganic EL elements, which emit light from a fluorescent material made of an inorganic material in the process of returning to a relaxed state from excitation generated when an alternating current voltage is applied to the inorganic fluorescent material so that accelerated electrons in an electrical field as intense as approximately $10^6$ V/cm collide against the center of light emission of the inorganic fluorescent material.

Furthermore, inorganic EL elements include dispersion type EL elements having a phosphor layer, where inorganic fluorescent material grains are dispersed in a binder made of a polymer organic material, and thin film type EL elements, where a dielectric layer is provided on one or both sides of a thin film phosphor layer having a thickness of approximately 1 μm. Dispersion type EL elements consume little power and are easy to manufacture, and thus have such an advantage that the cost of manufacture is low, and thus have been drawing attention. Conventional dispersion type EL elements have a multilayer structure and are formed of a substrate, a first electrode, a phosphor layer, a dielectric layer and a second electrode, which are layered in this order. The phosphor layer has a structure where inorganic fluorescent material grains, such as of ZnS:Mn, are dispersed in an organic binder, and the dielectric layer has a structure where a strong insulator, such as $BaTiO_3$, is dispersed in an organic binder. An alternating current power source is installed between the first electrode and the second electrode, so that the dispersion type EL element emits light when a voltage is applied across the first electrode and the second electrode from the alternating current power source.

In the structure of dispersion type EL elements, the phosphor layer is a layer determining the brightness and efficiency of the dispersion type EL element, and inorganic fluorescent material grains having a grain size of 15 μm to 35 μm are used in the phosphor layer, as described in WO03/020848. In addition, the color of light emitted from the phosphor layer of dispersion type EL elements is determined by the inorganic fluorescent material grains used in the phosphor layer, and in a case where ZnS:Mn is used for the inorganic fluorescent material grains, for example, the emitted light is orange, while in a case where ZnS:Cu is used for the inorganic fluorescent material grains, the emitted light is bluish green. Thus, the color of emitted light is determined by the inorganic fluorescent material grains used, and therefore, in a case where light of another color, for example white light, is emitted, an organic pigment is mixed into the organic binder so as to convert the color of emitted light to another color, so that the emitted light has the target color, as described in Japanese Patent Laid-open Publication H7-216351.

However, there is a problem, such that the light emitted by light emitting bodies used in dispersion type EL elements has a low brightness, and the life of the light emitting bodies is short.

A method for increasing the voltage applied to the phosphor layer is possible as a means for increasing the brightness of emitted light. In this case, there is another problem, such that the half-life of light emitted from the phosphor material shortens in inverse proportion to the applied voltage. Meanwhile, a method for lowering the voltage applied to the phosphor layer is possible as a means for elongating the half-life, that is to say, elongating the life, but there is a problem, such that the brightness of emitted light lowers. Thus, the brightness of emitted light and the half-life are inversely related, so that when one is improved by increasing or decreasing the voltage applied to the phosphor layer, the other deteriorates. Accordingly, either the brightness of emitted light or the life (the half-life of light output) must be selected. Here, in the present specification, the half-life is the time it takes for the light output to reduce to half of the original output in the brightness of emitted light.

Therefore, it has been proposed that EL elements be made to emit light at a low voltage, as described in Japanese Patent No. 3741157. The EL element 50 shown in FIG. 33 is a method for light emission where a voltage is applied across electrodes 52 and 54 between which a phosphor layer 53 is inserted, the phosphor layer 53 dispersing phosphor material grains 61 made of microscopic CdSe crystal in a medium of indium tin oxide 63, which is a transparent conductor. This EL element 50 is a current injection type light emitting element, and thus characterized by being operable at a low voltage.

SUMMARY OF THE INVENTION

In a case where the inorganic EL elements described above are used for a high-quality display device, such as a television, a brightness of approximately 300 cd/m$^2$ or more is required. However, the inorganic EL elements proposed in the above documents are not yet satisfactory in terms of the brightness of emitted light, and problems remain in practice.

In addition, it is usually necessary to apply an alternating current voltage of several hundred V with a high frequency of several tens of kHz in order to operate the inorganic EL elements, and there are also such problems as active elements, for example thin film transistors, being unusable or the cost of the drive circuits being high, and thus, the inorganic EL elements have not yet been put into practice.

Meanwhile, the present inventors continued diligent research in order to find a way to lower the voltage and increase the brightness for inorganic EL elements, and as a result they found out how to make an inorganic element which is operable with a direct current, and emits highly bright light at a voltage of several tens of V, which is sufficiently low in comparison with conventional inorganic EL elements (hereinafter referred to as "direct current operable inorganic EL element").

An object of the present invention is to provide a display with which highly bright images can be obtained when operated at a low voltage, and which has excellent uniformity in the brightness and color on the light emitting surface.

The above described object can be achieved with the display according to the present invention. That is to say, the display according to the present invention includes:
 a substrate;
 a plurality of parallel scan wires extending over the substrate in a first direction;
 a plurality of parallel data wires extending parallel to a surface of the substrate in a second direction perpendicular to the first direction;
 at least one switching element per intersection between the scan wires and the data wires;
 pixel electrodes connected to the switching elements;
 at least one phosphor layer provided above the pixel electrodes; and
 common electrodes provided above the phosphor layer,
 wherein the phosphor layer has a polycrystalline structure made of a first semiconductor material and a second semiconductor material segregated between grain boundaries in the polycrystalline structure,
 wherein the second semiconductor material is different from the first semiconductor material.

In addition, the display according to the present invention includes:
 a substrate;
 a plurality of parallel scan wires extending over the substrate in a first direction;
 a plurality of parallel data wires extending parallel to a surface of the substrate in a second direction perpendicular to the first direction;
 at least one switching element per intersection between the scan wires and the data wires;
 pixel electrodes connected to the switching elements;
 common electrodes provided on the same surface of the substrate as the pixel electrodes; and
 at least one phosphor layer provided above the pixel electrodes and the common electrodes,
 wherein the phosphor layer has a polycrystalline structure made of a first semiconductor material and a second semiconductor material segregated between grain boundaries in the polycrystalline structure,
 wherein the second semiconductor material is different from the first semiconductor material.

Furthermore, the common electrodes may be approximately parallel to the scan wires or the data wires and may extend in the first direction or the second direction.

In addition, the width of the common electrodes may be different at certain intervals in a direction perpendicular to the direction in which the common electrodes extend.

Furthermore, the pixel electrodes and the common electrodes may respectively have a structure in comb form and may be provided so that at least portions of the structure in comb form of the pixel electrodes and the common electrodes partially interlock.

In addition, the display according to the present invention includes:
 a substrate;
 common electrodes provided on the substrate;
 a dielectric layer provided over the common electrodes;
 a plurality of parallel scan wires extending over the dielectric layer in a first direction;
 a plurality of data wires extending parallel to a surface of the substrate in a second direction perpendicular to the first direction;
 at least one switching element per intersection between the scan wires and the data wires;
 pixel electrodes connected to the switching elements; and
 at least one phosphor layer provided above the pixel electrodes,
 wherein the phosphor layer has a polycrystalline structure made of a first semiconductor material and a second semiconductor material segregated between grain boundaries in the polycrystalline structure,
 wherein the second semiconductor material is different from the first semiconductor material.

Furthermore, the dielectric layer may have at least one opening per pixel at the intersections between the scan wires and the data wires. In this case, the common electrodes may be exposed through the openings in the dielectric layer and may face the phosphor layer.

In addition, the common electrodes may cover approximately the entire surface of the substrate.

Furthermore, the pixel electrodes and the exposed portions of the common electrodes may respectively have a structure in comb form and may be provided so that at least portions of the structure in comb form of the pixel electrodes and the exposed portions of the common electrodes partially interlock.

Moreover, a dielectric layer may be provided at least either in an interface between the pixel electrodes and the phosphor layer or in an interface between the exposed portions of the common electrodes and the phosphor layer.

In addition, a color converting layer may be provided, the color converting layer facing the pixel electrodes and the common electrodes and being located in the front in the direction in which light is emitted.

Furthermore, the first semiconductor material and the second semiconductor material may have a semiconductor structure of a different conductivity type. Moreover, the first semiconductor material may have an n type semiconductor structure and the second semiconductor material may have a p type semiconductor structure. In addition, the first semiconductor material and the second semiconductor material may be respectively made of a compound semiconductor. Furthermore, the first semiconductor material may be a compound semiconductor including an element in the twelfth group and an element in the sixteenth group. Moreover, the first semiconductor material may be a compound semiconductor including an element in the thirteenth group and an element in the fifteenth group. In addition, the first semiconductor material may be a chalcopyrite type compound semiconductor. Furthermore, the first semiconductor material has a cubic crystal structure.

In addition, the first semiconductor material may include at least one type of element selected from the group consisting of Cu, Ag, Au, Ir, Al, Ga, In, Mn, Cl, Br, I, Li, Ce, Pr, Nd, Pm, Sm, Eu, Gd, Tb, Dy, Ho, Er, Tm and Yb.

Furthermore, the average diameter of crystal grains in the polycrystalline structure made of the first semiconductor material may be in a range from 5 nm to 500 nm.

Moreover, the second semiconductor material may be one of $Cu_2S$, ZnS, ZnSe, ZnSSe, ZnSeTe, ZnTe, GaN and InGaN.

The display according to the present invention includes:
 a substrate;
 a plurality of parallel scan wires extending over the substrate in a first direction;
 a plurality of parallel data wires extending parallel to a surface of the substrate in a second direction perpendicular to the first direction;
 at least one switching element per intersection between the scan wires and the data wires;
 pixel electrodes connected to the switching elements;
 at least one phosphor layer provided above the pixel electrodes; and common electrodes provided above the phosphor layer,
wherein the phosphor layer has a p type semiconductor and an n type semiconductor.

The phosphor layer may be formed of n type semiconductor grains dispersed in a medium of a p type semiconductor. In addition, the phosphor layer may be formed of an aggregate of n type semiconductor grains and a p type semiconductor segregates between the grains.

Furthermore, the n type semiconductor grains may be electrically connected to the pixel electrodes and the common electrodes via the p type semiconductor.

In addition the display according to the present invention includes:
 a substrate;
 a plurality of parallel scan wires extending over the substrate in a first direction;
 a plurality of parallel data wires extending parallel to a surface of the substrate in a second direction perpendicular to the first direction;
 at least one switching element per intersection between the scan wires and the data wires;
 pixel electrodes connected to the switching elements;
 common electrodes provided on the same surface of the substrate as the pixel electrodes; and
 at least one phosphor layer provided above the pixel electrodes and the common electrodes,
 wherein the phosphor layer has a p type semiconductor and an n type semiconductor.

Furthermore, the phosphor layer may be formed of n type semiconductor grains dispersed in a medium of a p type semiconductor. In addition, it may be formed of an aggregate of n type semiconductor grains and a p type semiconductor segregates between the grains.

In addition, the n type semiconductor grains may be electrically connected to the first and second electrodes via the p type semiconductor.

Furthermore, the common electrodes may extend approximately parallel to the scan wires or the data wires in the first direction or the second direction. Moreover, the width of the common electrodes may be different at certain intervals in a direction perpendicular to the direction in which the common electrodes extend. In addition, the pixel electrodes and the common electrodes may respectively have a structure in comb form and may be provided so that at least portions of the structure in comb form of the pixel electrodes and the common electrodes partially interlock.

In addition, the display according to the present invention includes:
 a substrate;
 common electrodes provided on the substrate;
 a dielectric layer provided over the common electrodes;
 a plurality of parallel scan wires extending over the dielectric layer in a first direction;
 a plurality of parallel data wires extending parallel to a surface of the substrate in a second direction perpendicular to the first direction;
 at least one switching element per intersection between the scan wires and the data wires;
 pixel electrodes connected to the switching elements; and
 at least one phosphor layer provided above the pixel electrodes,
 wherein the phosphor layer has a p type semiconductor and an n type semiconductor.

Furthermore, the phosphor layer may be formed of n type semiconductor grains dispersed in a medium of a p type semiconductor. In addition, the phosphor layer may be formed of an aggregation of n type semiconductor grains and a p type semiconductor segregates between the grains.

In addition, the n type semiconductor grains may be electrically connected to the first and second electrodes via the p type semiconductor.

Furthermore, the dielectric layer may have at least one opening per pixel at the intersections between the scan wires and the data wires. In this case, it is preferable for the common electrodes to be exposed through the openings in the dielectric layer with facing the phosphor layer.

Moreover, the common electrodes may cover approximately the entire surface of the substrate. In addition, the pixel electrodes and the exposed portions of the common electrodes may respectively have a structure in comb form and may be provided so that at least portions of the structure in comb form of the pixel electrodes and the exposed portions of the common electrodes partially interlock. Furthermore, a dielectric layer may be provided at least either in an interface between the pixel electrodes and the phosphor layer or in an interface between the exposed portions of the common electrodes and the phosphor layer. Moreover, a color converting layer may be provided, the color converting layer facing the pixel electrodes and the common electrodes and being located in the front in the direction in which light is emitted.

In addition, the n type semiconductor and the second p type semiconductor may respectively be compound semiconductors. Furthermore, the n type semiconductor may be a compound semiconductor including an element in the twelfth group and an element in the sixteenth group. Moreover, the n type semiconductor may be a compound semiconductor including an element in the thirteenth group and an element in the fifteenth group. In addition, the n type semiconductor may be a chalcopyrite type compound semiconductor.

Furthermore, the p type semiconductor may be one of $Cu_2S$, ZnS, ZnSe, ZnSSe, ZnSeTe, ZnTe, GaN and InGaN.

The present invention can provide a display with which highly bright images can be obtained when operated at a low voltage, and which has excellent uniformity in the brightness and color on the display surface, and thus has high display quality.

The display provided by the present invention is a display with which highly bright images can be obtained when operated at a low voltage, and which has excellent uniformity in the brightness and color on the display surface, and thus has high display quality.

In the display according to the present invention, the phosphor layer has a polycrystalline structure made of an n type semiconductor material, where a p type semiconductor material segregates between grain boundaries in the polycrystalline structure. When the phosphor layer has the above described structure, the segregated p type semiconductor material between bound boundaries can improve the properties in terms of hole injection, and thus, a display which emits highly bright light at a low voltage and has a long life can be implemented.

In the display according to the present invention, the phosphor layer has either (i) a structure where n type semiconductor grains are dispersed in a medium of a p type semiconductor, or (ii) a structure of an aggregate of n type semiconductor grains where a p type semiconductor segregates between grains. When the phosphor layer has one of the above described structures, holes can be efficiently injected into the n type semiconductor grains or between grain boundaries together with electrons, and thus, a display which emits highly bright light at a low voltage and has a long life can be implemented.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

Figure 1:
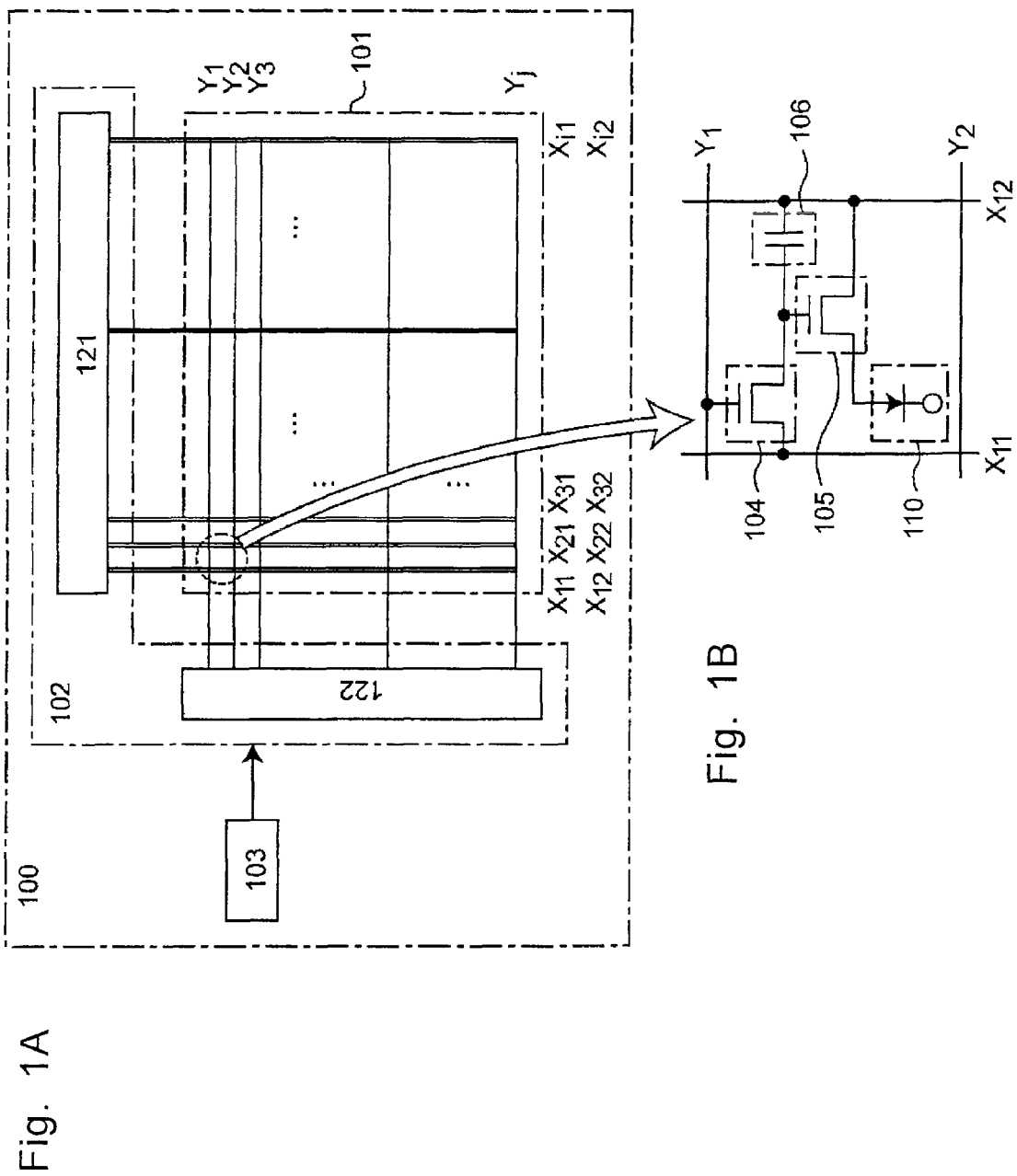
FIG. 1A is a schematic diagram showing the configuration of the display according to first embodiment of the present invention.
FIG. 1B is a schematic diagram showing the configuration of the pixels in the display portion of the display in FIG. 1A.

In the following, the display according to the embodiments of the present invention is described in reference to the accompanying drawings. Here, the same symbols are attached to members which are substantially the same in the drawings.

First Embodiment

Outline of Configuration of Display

The display 100 according to first embodiment of the present invention is described in reference to FIGS. 1A and 1B. FIG. 1A is a block diagram schematically showing the configuration of the display 100 according to first embodiment. As shown in FIG. 1A, the display 100 is formed of a display portion 101 where a plurality of pixels are two-dimensionally aligned, a drive means 102 for selectively driving the pixels, and a power source 103 for driving which supplies power to the drive means 102. Here, in the present first embodiment, a direct current power source is used as the power source 103. In addition, the drive portion 102 is provided with a data electrode drive circuit 121 for driving data electrodes $X_{i1}$ and a scan electrode drive circuit 122 for driving scan electrodes $Y_j$.

The display portion 101 is provided with an EL element array where pixels are two-dimensionally aligned in i columns×j rows, the display portion 101 including a plurality of data electrodes $X_{1l}, X_{2l}, X_{3l} \ldots X_{il}$ extending in a first direction parallel to the surface of the EL element array, a plurality of scan electrodes $Y_1, Y_2, Y_3 \ldots Y_j$ extending in a second direction perpendicular to the first direction, and a plurality of current supplying wires $X_{12}, X_{22}, X_{32} \ldots X_{i2}$ extending in a first direction parallel to the surface of the EL element array. One pixel is formed per intersection between the data electrodes $X_{il}$ and the scan electrodes $Y_j$.

FIG. 1B is a schematic diagram showing the configuration of the pixels in FIG. 1A. Each pixel is formed of a data electrode $X_{il}$, a scan electrode $Y_j$, a current supplying wire $X_{i2}$, a switching element 104 connected to the data electrode $X_{il}$ and the scan electrode $Y_j$, a current drive circuit 105, a capacitor 106 and an EL element 110. The capacitor 106 is connected to the switching element 104 and the current supplying wire $X_{i2}$. The current drive circuit 105 is connected to the switching element 104, the capacitor 106 and the EL element 110. That is to say, the display is an active matrix display.

When the switching element 104 is turned on, a signal voltage from the data wire $X_{11}$ is written into the capacitor 106, so that the gate voltage of the switching element is determined in accordance with the signal voltage at that time, and a current is supplied to the EL element 110 from the current supplying wire $X_{12}$ through the current drive element 105 in accordance with the conductivity.

<Wire Configuration of Display>

Figure 2:
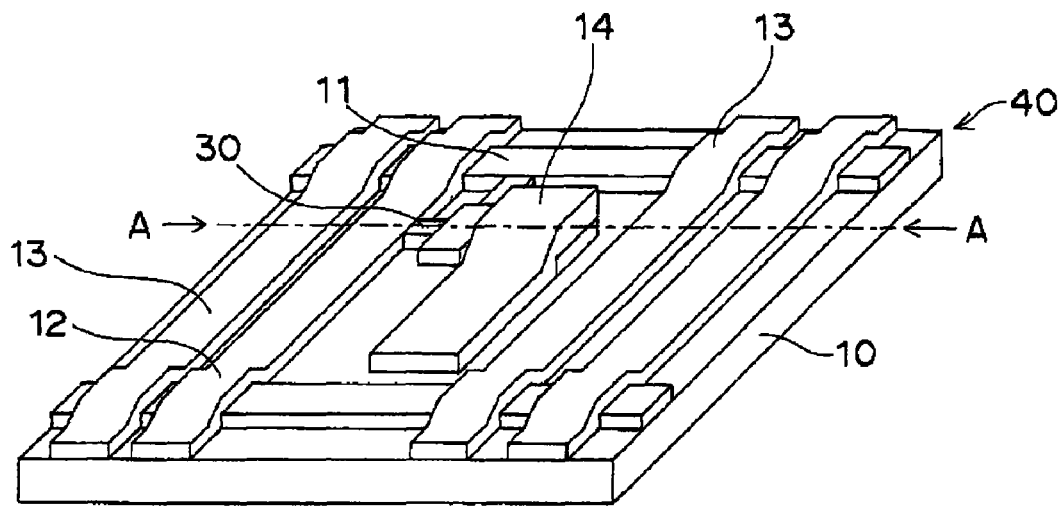
FIG. 2 is a schematic diagram showing the wires in the pixels in the display portion of the display according to first embodiment of the present invention.

FIG. 2 is a perspective diagram schematically showing the configuration of wires in a pixel of the display 100 according to the first embodiment. This active matrix display 100 is provided with a plurality of scan wires 11 extending in a first direction parallel to the light emitting surface and a plurality of data wires 12 extending in a second direction parallel to the light emitting surface and perpendicular to the first direction. A thin film transistor 30 (hereinafter referred to as "TFT"), which is a switching element, is provided per intersection between the scan wires 11 and the data wires 12. In addition, the region surrounded by two adjacent scan wires 11 and two adjacent beta wires 12 is one pixel, and a plurality of these pixels are aligned two-dimensionally. Each pixel is provided with at least one pixel electrode 14 and connected to a TFT 30. Furthermore, supply of a current is essential in EL elements, unlike with LCD's, and therefore, a power supplying wire 13 is provided so as to extend approximately parallel to the data wire 12. Here, a substrate 10 is provided to support the above described wires, electrodes and TFT 30, and the whole forms an array substrate 40.

<Cross Sectional Configuration of Display>

Figure 3:
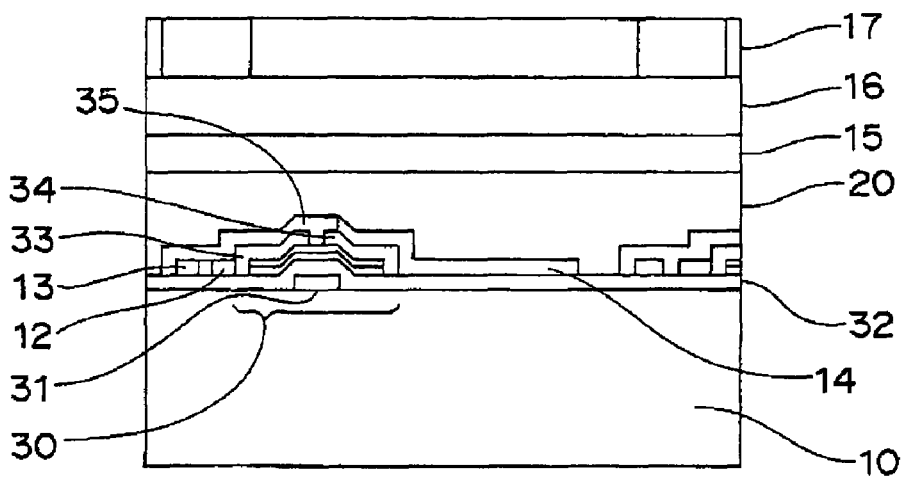
FIG. 3 is a schematic cross sectional diagram along line A-A in FIG. 2 as viewed in the direction perpendicular to the light emitting surface.
Figure 4:
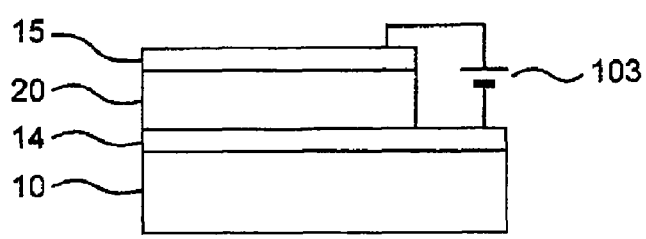
FIG. 4 is a schematic cross sectional diagram showing the configuration of the EL element in the pixels.

In addition, FIG. 3 is a schematic cross sectional diagram along line A-A in FIG. 2 as viewed in the direction perpendicular to the light emitting surface. FIG. 4 is a schematic diagram showing the pixel in FIG. 3, which is regarded as one EL element 110. In this display, a phosphor layer 20 is formed approximately in a plane above the array substrate 40 made up of the substrate 10 and the above described wires and electrodes arranged on the substrate 10, so that the phosphor layer 20 forms a light emitting portion in the display 100. In addition, a common electrode 15 is formed above the phosphor layer 20. One schematic EL element 110 is formed in the pixel selected by the scan wire 11 and the data wire 12. This schematic EL element 110 is formed of a pixel electrode 14, a phosphor layer 20 and a common electrode 15, which are layered in this order on the substrate 10. In the EL element 110 formed in one pixel, there occurs a difference in potential between the pixel electrode 14 and the common electrode 15 when an external voltage, which is for example, a voltage from the direct current power source 103, is applied to the pixel electrode 14 via the TFT 30. When the difference in potential becomes the voltage for starting light emission or higher, a current flows through the phosphor layer 20 and light is emitted. The light is emitted to the outside through the surface on the side opposite to the array substrate 40.

Here, the structure of the display 100 is not limited to the above, and various modifications are possible; for example, a plurality of phosphor layers 20 may be provided, all of the scan wires 11, data wires 12, pixel electrodes 14 and common electrodes 15 may be transparent electrodes, any one of the electrodes may be a black electrode, a structure for sealing part or the entirety of the display 100 may be additionally provided, or the structure for converting the color of light emitted from the phosphor layer 20 may be additionally provided in the front in the direction in which light is emitted. In addition, in a case of a color display, various modifications are possible; for example, the phosphor layer may be divided into different colors: R, G and B, light emitting units for the respective colors R, G and B may be layered, or R, G and B may be displayed separately through a combination of a single color or two color phosphor layer, a color filter (color filter 17 in FIG. 3), and/or a color converting filter (color converting layer 16 in FIG. 3).

In the following, the components of the display 100 are described in detail.

<Substrate>

A highly electrically insulating material which can support the layers formed on the substrate 10 is used for the substrate 10. As the material, glass, for example Corning 1737, crystal, ceramic, a metal substrate having a dielectric layer on the surface, or a silicon wafer can be used. Non-alkaline glass or soda lime glass where the surface of the glass is coated with alumina or the like as an ion barrier layer may be used in order to prevent the alkaline ions included in conventional glass from negatively affecting the phosphor layer 20. In addition, polyester, polyethylene terephthalate based resins, combinations of polychlorotrifluoroethylene based resin and nylon 6, fluorine resin based materials, and resin films of polyethylene, polypropylene, polyimide or polyamide, can also be used. A material that is excellent in terms of endurance, flexibility, transparency, electrical insulation and moisture proofness, is used for the resin film. These are merely examples, and the material for the substrate 10 is not particularly limited to these.

<Electrodes>

Any publicly known conductive material having low resistance can be used for the pixel electrodes 14 and the common electrodes 15. A metal material, such as Pt, Au, Pd, Ag, Ni, Cu, Al, Ru, Rh, Ir, Cr, Mo, W, Ta, Nb and Ti, or a multilayer structure of these, is preferable. A material other than a metal, such as a metal oxide of which the main component is ITO, InZnO, ZnO or $SnO_2$, a conductive polymer, such as polyaniline, polypyrrole, PEDOT [poly(3, 4-ethylenedioxythiophene)]/PSS (polystyrene sulfonate), or conductive carbon can be used together with a metal material in a multilayer structure or the like in order to lower the resistance. Here, different materials may be used for the pixel electrodes 14 and the common electrodes 15. In a case where the pixel electrodes 14 are anodes and the common electrodes 15 are cathodes in the configuration, for example, a material having good hole injection and a high work function may be selected for the pixel electrodes 14, and a material having good electron injection and a low work function may be selected for the common electrodes 15.

<Phosphor Layer>

Figure 5:
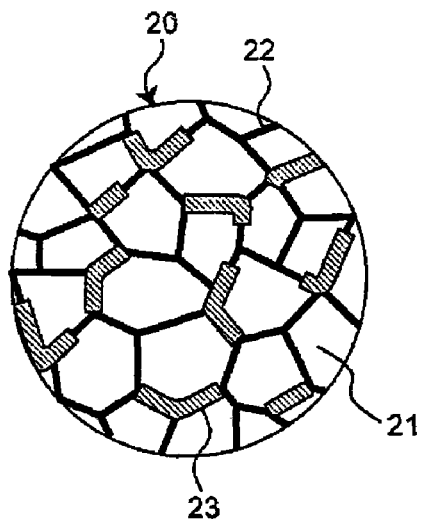
FIG. 5 is an enlarged diagram schematically showing the configuration of the phosphor layer in FIG. 4.

Next, the phosphor layer 20 is described. FIG. 5 is a schematic diagram showing an enlargement of the structure of the phosphor layer 20. The phosphor layer 20 has a polycrystalline structure made of a first semiconductor material 21, which is a structure where a second semiconductor material 23 segregates between grain boundaries 22 in the polycrystalline. A semiconductor material having n type conductivity where the majority carrier is electrons is used for the first semiconductor material 21. Meanwhile, a semiconductor material having p type conductivity where the majority carrier is holes is used for the second semiconductor material 23, and the first semiconductor material 21 and the second semiconductor material 23 are electrically connected. Holes and electrons injected through electrodes recombine in the above described portions where the material segregates, which are dispersed in the phosphor layer with high density, and thus, light is emitted. Likewise, when the carriers further pass through the donor or acceptor level for recombination, or other ion species are in the vicinity, light emission becomes possible through energy transfer.

A material of which the band gap ranges from the near ultraviolet light region to the visible light region (1.7 eV to 3.6 eV) is preferable for the first semiconductor material 21, and a material of which the band gap ranges from the near ultraviolet light region to the blue region (2.6 eV to 3.6 eV) is more preferable. Concretely, a compound including an element in the twelfth group and an element in the sixteenth group, such as ZnS, ZnSe, ZnTe, CdS or CdSe, a mixed crystal of these (for example ZnSSe), a compound including an element in the second group and an element in the sixteenth group, such as CaS or SrS, a mixed crystal of these (for example CaSSe), a compound including an element in the thirteenth group and an element in the fifteenth group, such as AlP, AlAs, GaN or GaP, a mixed crystal of these (for example InGaN), or a mixed crystal of the compounds, for example ZnMgS, CaSSe or CaSrS, can be used. Furthermore, a chalcopyrite type compound, such as $CuAlS_2$, may be used. Moreover, a material of which the main portion has a cubic crystal structure is preferable for the polycrystalline made of the first semiconductor material. In addition, one or more types of atoms or ions selected from the group consisting of Cu, Ag, Au, Ir, Al, Ga, In, Mn, Cl, Br, I, Li, Ce, Pr, Nd, Pm, Sm, Eu, Gd, Tb, Dy, Ho, Er, Tm and Yb may be included as an additive. The color of light emitted from the phosphor layer 20 is determined by the element.

Meanwhile, the second semiconductor material 23 is $Cu_2S$, ZnS, ZnSe, ZnSSe, ZnSeTe, ZnTe, GaN or InGaN. One or more types of atoms from among N, Cu and In may be included as an additive for adding p type conductivity.

The structure of the phosphor layer 20 can be implemented in accordance with such a manufacturing method as a sintering method, a vapor synthesizing method, an explosion method, a water heat synthesizing method, a high temperature, high pressure synthesizing method, a flux method or a coprecipitation method.

The display 100 according to the present first embodiment is characterized in that the phosphor layer 20 has a polycrystalline structure made of an n type semiconductor material 21, and a p type semiconductor material 23 segregates between the grain boundaries 22 in the polycrystalline structure. In conventional inorganic EL's, although the crystallinity of the phosphor layer is enhanced in order to prevent accelerated electrons in an intense electrical field from being scattered, ZnS and ZnSe generally have n type conductivity and do not supply sufficient holes, and thus, highly bright light emission cannot be expected from the recombination of electrons and holes. Meanwhile, the grain boundaries in the crystal uniquely expand when crystal grains in the phosphor layer grow, unless the crystal is single crystal. In conventional inorganic EL elements to which a high voltage is applied, a problem arises, such that the grain boundaries in the direction of the film thickness become a conductive path, causing the withstand voltage to lower. In contrast, the present inventors found as a result of diligent research that hole injection can be improved by the p type semiconductor material which segregates between grain boundaries when the phosphor layer 20 has a polycrystalline structure made of an n type semiconductor material 21, and a p type semiconductor material 23 segregates between the grain boundaries 22 in the polycrystalline structure. Furthermore, the inventors found that light is emitted efficiently through recombination of electrons and holes when segregated portions are dispersed in the phosphor layer 20 with high density. As a result, a light emitting element which emits bright light at a low voltage can be implemented, and thus, the present invention was achieved. In addition, when donors or acceptors are introduced, recombination of free electrons and holes captured by the acceptors, recombination of free holes and electrons captured by the donors, and light emission through the combination of donors and acceptors are also possible. Likewise, when other ion species are in the vicinity, light emission is possible through energy transfer.

In the following, an example of the manufacturing method for the display 100 according to first embodiment is described. It is possible to use the same manufacturing method in a case where a phosphor layer made of another material is used, as described above.

(1) A glass substrate 10 is prepared.

(2) Scan wires 11 and gate electrodes 31 connected to the scan wires 11 are formed on the substrate 10. Al is used, for example, and approximately parallel patterns are formed at predetermined intervals in accordance with a photolithographic method. The film thickness is 200 nm.

(3) A dielectric layer, such as of silicon nitride, is formed over the scan wires 11 as a gate insulating film 32 for TFT's 30.

(4) An amorphous silicon layer for providing a switching function to the TFT's 30, for example, is layered on the insulating layer 32, and furthermore, an N+ amorphous silicon layer is layered on the so that a pattern is formed.

(5) Next, a pattern for sources 33, drains 34 and pixel electrodes 14 connected to the drains 34 is formed using Ta, for example. The film thickness is 100 nm.

(6) Next, a pattern for data wires 12 and current supply wires 13 is formed using Al, for example. The data wires 12 and the current supply wires 13 are approximately parallel with predetermined intervals in between, and approximately perpendicular to the scan wires 11. The film thickness is 200 nm.

(7) Next, a pattern for an insulating layer, such as of silicon nitride, is formed as a protective layer 35 so that the pixel electrodes 14 are exposed. Thus, an array substrate 40 is formed.

(8) A phosphor layer 20 is formed on the substrate 10 in the following manner. First, a powder of ZnS and $Cu_2S$ is put in a plurality of vaporization sources, and each material is irradiated with an electron beam in a vacuum (in the order of $10^{-6}$ Torr) so that the ZnS and $Cu_2S$ are vapor deposited together on the array substrate 40, and after that, an annealing process is carried out, so that a phosphor layer 20 having a polycrystal structure of ZnS and a segregated portion of $Cu_xS$ is obtained. When this film is observed through X-ray diffraction or using an SEM, a polycrystal structure with microscopic ZnS crystal grains and segregated portions of $Cu_xS$ can be seen. Although the details are not clear, it is believed that phases of ZnS and $Cu_xS$ separate and the segregated structures are formed.

(10) Next, a pattern for common electrodes 15 is formed using ITO, for example. The film thickness is 200 nm.

(11) Next, a transparent insulating layer, such as of silicon nitride, is formed over the common electrodes 15 as a protective layer (not shown), for example.

The display 100 according to the first embodiment can be obtained through the above described steps. The light emitted from this display 100 is highly bright when operated at a voltage of as low as approximately 5 V to 10 V.

Here, the structure is not limited to the above, and appropriate modifications are possible; for example low temperature polysilicon, CG silicon or organic TFT's can be used for the TFT's 30, which are switching elements. In addition, it is also possible to provide a structure where each pixel is provided with a plurality of TFT's, so that the pixel selecting function and the drive function are separate. For example, one pixel may be formed of two TFT's: a drive TFT and a selection TFT, a capacitor provided between these, and a power supply wire connected to the source of the drive TFT. The pixel electrode may be connected to the drain of the drive TFT. In this case, a signal voltage from the data wire can be written into the capacitor when the selection TFT connected to the scan wire is turned on, and at the same time, the drive TFT is turned on. The gate voltage of the drive TFT is determined in accordance with the signal voltage at that time, and a current corresponding to the conductance is supplied to the phosphor layer from the current supply wire through the pixel electrode. Here, the structure is not limited to the above, and appropriate modifications are possible using publicly known drive technology for controlling the current or a technology for controlling middle tones.

In addition, the phosphor layer may be formed of films of fluorescent bodies for different colors in a case of a color display. Alternatively, light emitting units for the respective colors: R, G and B, may be layered so as to provide transparent electrode/phosphor layer/rear electrode. Furthermore, in another example for a color display a display having a single color or two-color phosphor layer may be fabricated, and after that the respective colors: R, G and B may be shown using color filters and/or color converting filters.

Figure 6:
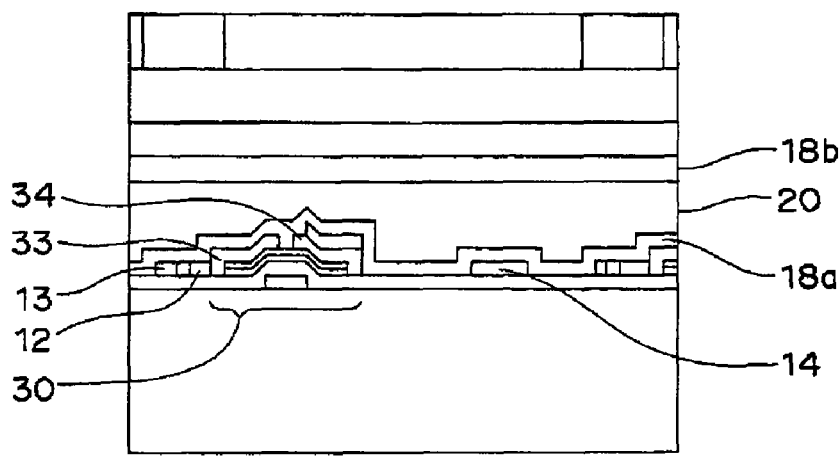
FIG. 6 is a schematic cross sectional diagram showing a modification of the display according to first embodiment of the present invention as viewed in the direction perpendicular to the light emitting surface.
Figure 7:
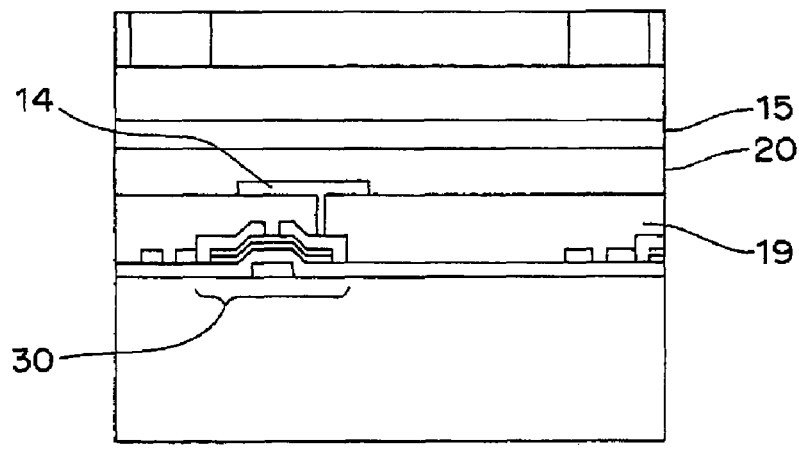
FIG. 7 is a schematic cross sectional diagram showing another modification of the display according to first embodiment of the present invention as viewed in the direction perpendicular to the light emitting surface.

In addition, appropriate modifications of first embodiment are also possible; for example, a protective dielectric film 18a is formed on the pixel electrodes 14, and furthermore, a thin dielectric layer 18b is formed beneath the common electrodes 15 for drive with an alternating current as shown in the schematic cross sectional diagram of FIG. 6, or, as shown in the schematic cross sectional diagram of FIG. 7, a flattened dielectric layer 19 is formed, and pixel electrodes 14 are formed on the flattened dielectric layer 19 so as to be connected to the drains 34 through contact holes.

Effects of the Invention

The display according to the present first embodiment uses a phosphor layer having high efficiency for light emission, and thus makes it possible to emit light with higher brightness when driven at a lower voltage than in the related art.

Second Embodiment

Outline of Configuration of Display

Figure 8:
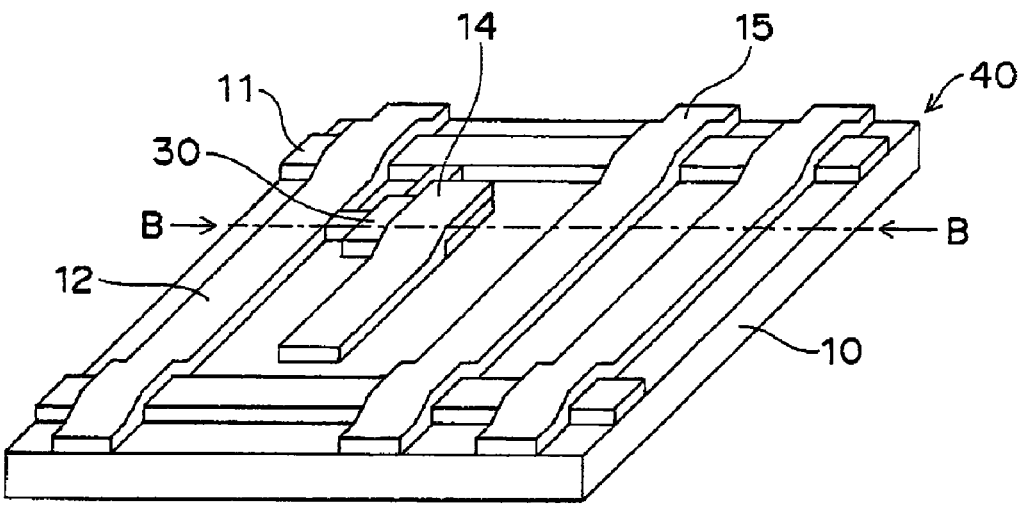
FIG. 8 is a schematic diagram showing the wires in the pixels of the display portion in the display according to second embodiment of the present invention.
Figure 9:
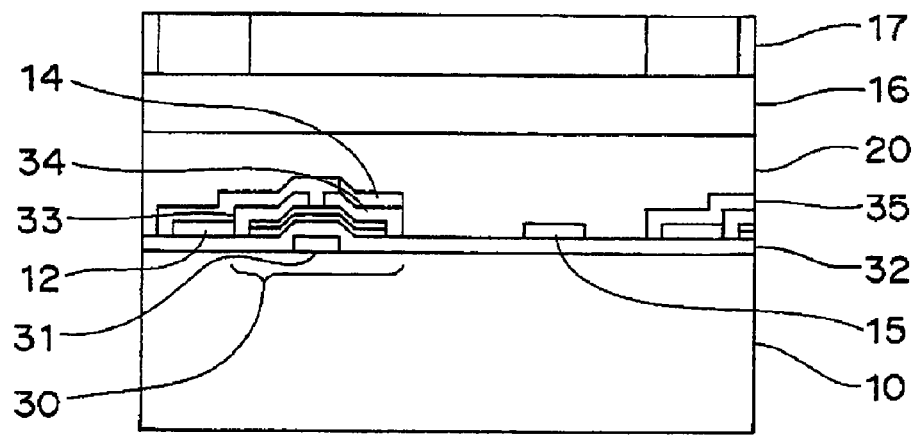
FIG. 9 is a schematic cross sectional diagram along line B-B in FIG. 8 as viewed in the direction perpendicular to the light emitting surface.

FIG. 8 is a plan diagram schematically showing the configuration of wires in the pixels of the display according to the second embodiment. In addition, FIG. 9 is a cross sectional diagram along line B-B in FIG. 8 schematically showing the structure as viewed in the direction perpendicular to the light emitting surface. This active matrix display 10 is provided with a plurality of scan wires 11 extending in a first direction parallel to the light emitting surface and a plurality of data wires 12 extending parallel to the light emitting surface in a second direction perpendicular to the first direction. Thin film transistors 30 (hereinafter referred to as "TFT's"), which are switching elements, are provided at the intersections between the scan wires 11 and the data wires 12. In addition, a region surrounded by two adjacent scan wires 11 and two adjacent data wires 12 is one pixel, and a plurality of pixels are aligned two-dimensionally. Each pixel is provided with at least one pixel electrode 14 that is connected to a TFT 30. Furthermore, at least one common electrode 15 is provided to make a pair with each pixel electrode 14, and the common electrodes 15 extend approximately parallel to the data wires 12. A substrate 10 is provided so as to support these wires, electrodes and TFT's 30, and thus, an array substrate 40 is formed. Furthermore, an approximately flat phosphor layer 20 is formed on the array substrate 40 so as to form a light emitting portion in the display 100. When an external voltage is applied to the pixel electrode 14 via the TFT 30 in a pixel selected by a scan wire 11 and a data wire 12, there occurs a difference in potential between the pixel electrode 14 and the common electrode 15. When the difference in potential becomes of a light emission starting voltage or higher, a current flows through the phosphor layer 20 and light is emitted. Light is emitted to the outside from the phosphor layer 20 through the surface on the side opposite to the array substrate 40.

This display 100 has a structure where the pixel electrodes 14 and the common electrodes 15 are provided approximately on the same side of the phosphor layer 20. The resistivity of the phosphor layer 20 is in a semiconductor region, and thus, a current flows at a low voltage, and light is emitted in the above configuration. In addition, this configuration does not require a transparent electrode, and wires and electrodes can be formed of a metal material having a sufficiently low resistance, and therefore, the voltage can be prevented from dropping due to the resistance of the transparent electrode. Here, the configuration is not limited to the above, and the common electrodes 15 may extend approximately parallel to the scan electrodes 11. In addition, various modifications are possible; for example the pixel electrodes 14 and the common electrodes 15 may be black electrodes, such a structure that part or the entirety of the display is sealed for protection (not shown) may be additionally provided, and a structure for converting the color of light emitted from the phosphor layer 20 toward the front relative to the direction in which light is emitted (color converting layer 16 in FIG. 9) may be further provided. In addition, various modifications are also possible for the color display; for example the phosphor layer may be divided into different colors: R, G and B, light emitting units for the respective colors: R, G and B may be layered, and the respective colors: R, G and B may be shown using a combination of a single color or two-color phosphor layer, color filters (color filter 17 in FIG. 9) and/or color converting filters.

Here, component members which are substantially the same as the component members in the display according to the first embodiment can be used in the display according to the present second embodiment except the component members that explains the characteristics.

In the following, an example of the manufacturing method for the display according to second embodiment is described. It is possible to use the same manufacturing method in a case where a phosphor layer 20 made of another material is used, as described above.

(1) A glass substrate 10 is prepared.
(2) Scan wires 11 and gate electrodes 31 connected to the scan wires 11 are formed on the glass substrate 10. Al is used, for example, and approximately parallel patterns are formed at predetermined intervals in accordance with a photolithographic method. The film thickness is 200 nm.
(3) An insulating layer, such as of silicon nitride, is formed over the scan wires 11 as a gate insulating film 32 for TFT's 30.
(4) An amorphous silicon layer for providing a switching function to the TFT's 30, for example, is layered on the insulating layer, and furthermore, an N+ amorphous silicon layer is layered thereon, so that a pattern is formed.
(5) In addition, a pattern for sources 33, drains 34 and pixel electrodes 14 connected to the drains 34 is formed using Ta, for example. The film thickness is 100 nm.
(6) Furthermore, a pattern for an insulating layer of silicon nitride, for example, is formed as a protective layer 35, so that the pixel electrodes 14 are exposed.
(7) Next, a pattern for data wires 12 and common electrodes 15 is formed using Al, for example. The data wires 12 are approximately parallel with predetermined intervals in between, and approximately perpendicular to the scan wires 11. In addition, the common electrodes 15 are formed between adjacent data wires 12 and pixel electrodes 15 so as to be approximately parallel to the data wires 12. The film thickness is 200 nm. Thus, an array substrate 40 is formed.
(8) Next, a phosphor layer 20 is formed on the array substrate 40. A powder of ZnS and $Cu_2S$ is put in a plurality of vaporization sources, and each material is irradiated with an electron beam in a vacuum (in the order of $10^{-6}$ Torr) so that the ZnS and $Cu_2S$ are vapor deposited together on the array substrate 40, and after that, an annealing process is carried out, so that a phosphor layer 20 having a polycrystal structure of ZnS and a segregated portion of $Cu_xS$ is obtained.
(9) Furthermore, a transparent insulating layer, such as of silicon nitride, is formed over the phosphor layer 20 as a protective layer (not shown), for example.

The display according to the second embodiment can be obtained through the above described steps. In this display, the uniformity in the brightness within the surface is high in comparison with active matrix displays having a configuration of upper and lower electrodes where a common electrode is formed above the phosphor layer as a transparent electrode.

Here, the structure is not limited to the above, and appropriate modifications are possible; for example low temperature polysilicon, CG silicon or organic TFT's can be used for the TFT's 30, which are switching elements. In addition, it is also possible to provide a structure where each pixel is provided with a plurality of TFT's, so that the pixel selecting function and the drive function are separate. For example, one pixel may be formed of two TFT's: a drive TFT and a selection TFT, a capacitor provided between these, and a power supply wire connected to the source of the drive TFT. The pixel electrode 14 may be connected to the drain of the drive TFT. In this case, a signal voltage from the data wire 12 can be written into the capacitor when the selection TFT connected to the scan wire 11 is turned on, and at the same time, the drive TFT is turned on. The gate voltage of the drive TFT is determined in accordance with the signal voltage at that time, and a current corresponding to the conductance is supplied to the phosphor layer 20 from the current supply wire through the pixel electrode 14. Here, the structure is not limited to the above, and appropriate modifications are possible using publicly known drive technology for controlling the current or a technology for controlling middle tones.

Figure 10:
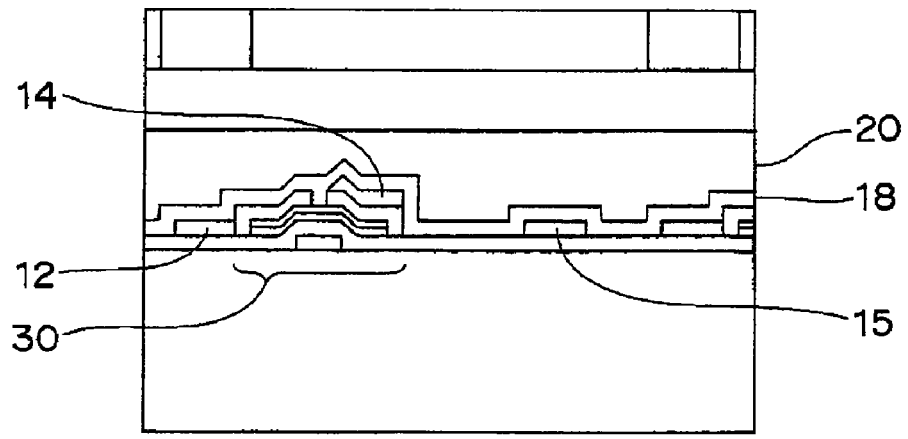
FIG. 10 is a schematic cross sectional diagram showing a modification of the display according to second embodiment of the present invention as viewed in the direction perpendicular to the light emitting surface.
Figure 11:
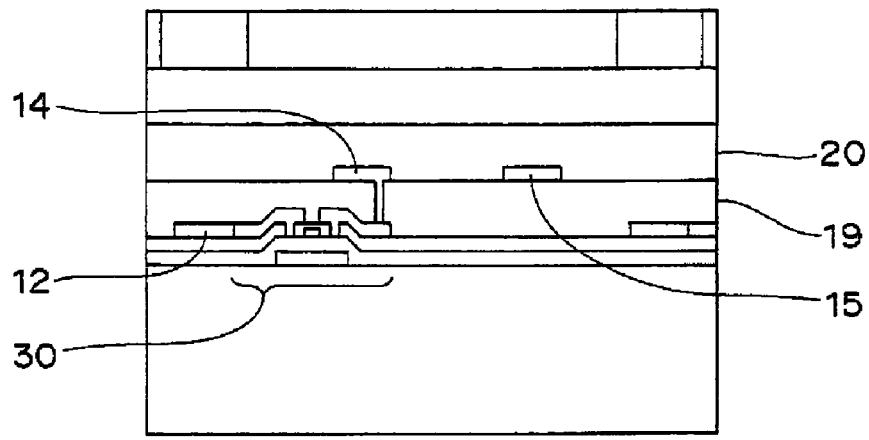
FIG. 11 is a schematic cross sectional diagram showing another modification of the display according to second embodiment of the present invention as viewed in the direction perpendicular to the light emitting surface.
Figure 12:
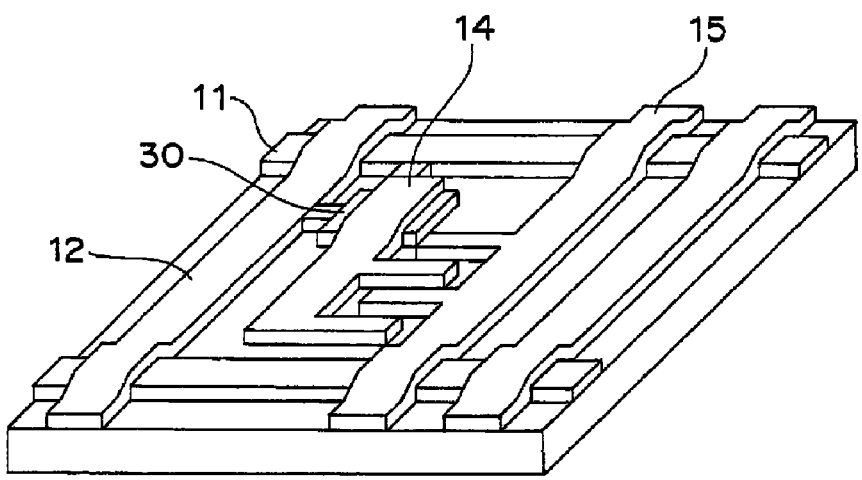
FIG. 12 is a perspective diagram schematically showing the wires in the pixels of the display portion in still another modification of the display according to second embodiment of the present invention.
Figure 13:
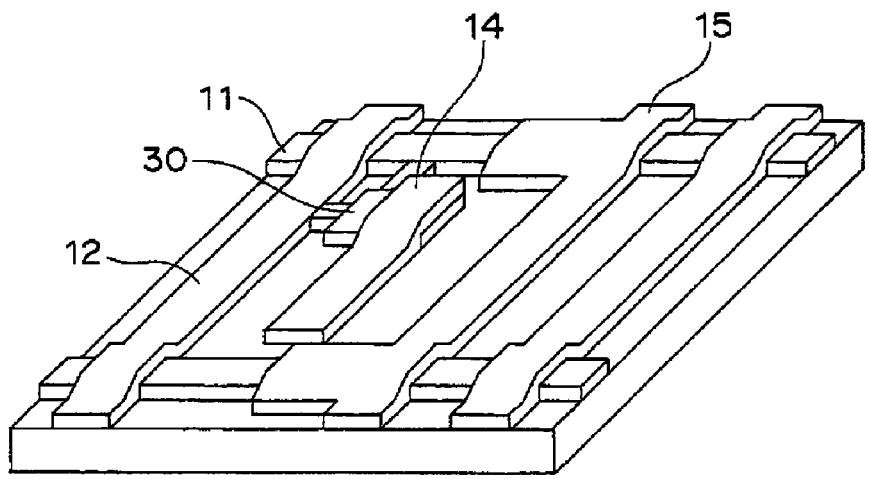
FIG. 13 is a perspective diagram schematically showing the wires in the pixels of the display portion in yet another modification of the display according to second embodiment of the present invention.

In addition, appropriate modifications of second embodiment are also possible; for example, a thin dielectric layer 18 may be formed over the pixel electrodes 14 and the common electrodes 15 for the drive with an alternating current, as shown in the schematic cross sectional diagram of FIG. 10, and a flattened dielectric layer 19 may be formed and the pixel electrodes 14 and the common electrodes 15 formed via contact holes, as shown in the schematic cross sectional diagram of FIG. 11. Furthermore, any form is possible for the pixel electrodes 14 and the common electrodes 15 in terms of the width, the length and the thickness. As shown in the perspective diagram of FIG. 12, for example, the pixel electrodes 14 and the common electrodes 15 are in comb form, and the comb portions thereof interlock. As a result, uniform light emission can be achieved without specifying a conductive path between the pixel electrodes 14 and the common electrodes 15. In addition, as shown in the perspective diagram of FIG. 13, the width of the common electrode 15 may be greater in a non-pixel region. The width of the common electrodes 15 in a direction perpendicular to the direction in which the common electrodes 15 extend may be greater along the gate wires 11. As a result, the effects of heat release from the common electrodes 15 toward the gate electrodes 11 can be improved.

Effects of the Invention

In the direct current drive type inorganic EL element according to the present inventors, the phosphor layer has a resistivity in the semiconductor region, and in a case where it is applied to a display having a matrix structure, the voltage drop resulting from the resistance of the transparent electrode is expected to be great and raise a problem in practical use. The phosphor layer of the direct current drive inorganic EL elements has a rather low resistance, and thus, the present inventors found that light emission is possible through conduction of the phosphor layer 20 in the surface direction, and thus, the configuration of the display according to the second embodiment can be implemented. Light can be emitted through conduction in the surface direction of the phosphor layer 20 having a low resistance in the display according to the second embodiment. As a result, the transparent electrode, for example of ITO, becomes unnecessary, and the display can be formed of only metal electrodes. The metal electrodes have a sufficiently low resistance, and therefore, highly bright light emission is possible, and the voltage can be prevented from dropping due to the resistance of the electrodes, and thus, the brightness within the surface and the uniformity in the color can be improved.

Third Embodiment

Outline of Configuration of Display

Figure 14:
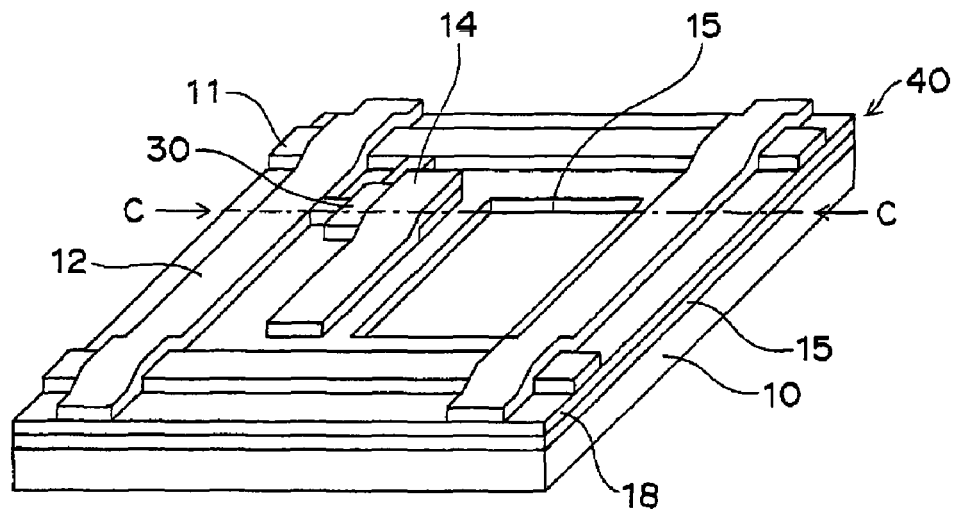
FIG. 14 is a schematic diagram showing the wires in the pixels of the display portion in the display according to third embodiment of the present invention.
Figure 15:
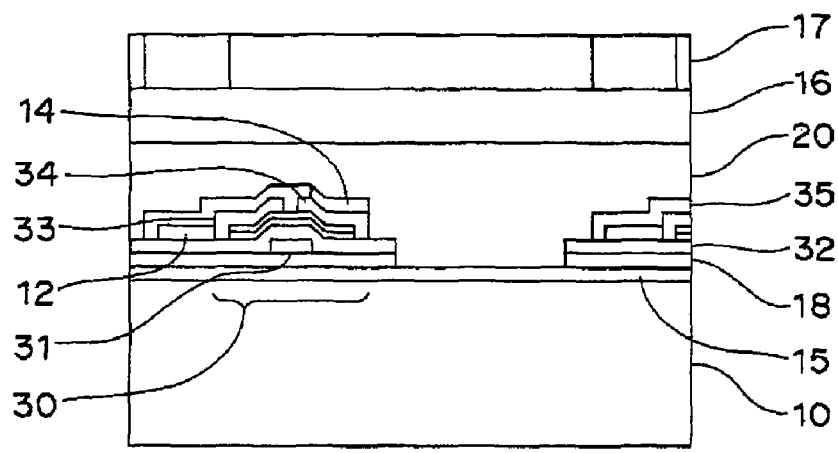
FIG. 15 is a schematic cross sectional diagram along line C-C in FIG. 14 as viewed in the direction perpendicular to the light emitting surface.

FIG. 14 is a plan diagram schematically showing the configuration of wires in the pixels of the display according to the present third embodiment. In addition, FIG. 15 is a cross sectional diagram along line C-C in FIG. 14 as viewed in the direction perpendicular to the light emitting surface. This active matrix display is provided with a plurality of scan wires 11 extending in a first direction parallel to the light emitting surface and a plurality of data wires 12 extending parallel to the light emitting surface in a second direction perpendicular to the first direction. Thin film transistors 30 (hereinafter referred to as "TFT's"), which are switching elements, are provided at the intersections between the scan wires 11 and the data wires 12. In addition, a region surrounded by two adjacent scan wires 11 and two adjacent data wires 12 is one pixel, and a plurality of pixels are aligned two-dimensionally. Each pixel is provided with at least one pixel electrode 14 that is connected to a TFT 30. Furthermore, a common electrode 15 is provided to make a pair with each pixel electrode 14, the common electrode 15 covering approximately the entire surface. The common electrodes 15 are provided so as to be electrically isolated from the wires, electrodes and TFT's 30 by means of the dielectric layer 18. The dielectric layer 18 has at least one opening per pixel, through which the common electrodes 15 in the lower layer are exposed. Furthermore, a substrate 10 is provided so as to support these wires, electrodes and TFT's 30, and thus, an array substrate 40 is formed. Furthermore, an approximately flat phosphor layer 20 is formed on the array substrate 40 so as to form a light emitting portion in the display. When an external voltage is applied to the pixel electrode 14 via the TFT 30 in a pixel selected by a scan wire 11 and a data wire 12, there occurs a difference in potential between the pixel electrode 14 and the common electrode 15. When the difference in potential becomes of a light emission starting voltage or higher, a current flows through the phosphor layer 20 and light is emitted. Light is emitted to the outside from the phosphor layer 20 through the surface on the side opposite to the array substrate 40.

This display 100 has a structure where the pixel electrodes 14 and the common electrodes 15 are provided approximately on the same side of the phosphor layer 20. The resistivity of the phosphor layer 20 is in a semiconductor region, and thus, a current flows at a low voltage, and light is emitted in the above configuration. In addition, this configuration does not require a transparent electrode, and wires and electrodes can be formed of a metal material having a sufficiently low resistance, and therefore, the voltage can be prevented from dropping due to the resistance of the transparent electrode. Here, the configuration is not limited to the above, and the common electrodes 15 may extend approximately parallel to the scan electrodes 11. In addition, various modifications are possible; for example the pixel electrodes 14 and the common electrodes 15 may be black electrodes, such a structure that part or the entirety of the display is sealed for protection (not shown) may be additionally provided, and a structure for converting the color of light emitted from the phosphor layer 20 toward the front relative to the direction in which light is emitted (color converting layer 16 in FIG. 15) may be further provided. In addition, various modifications are also possible for the color display; for example the phosphor layer may be divided into different colors: R, G and B, light emitting units for the respective colors: R, G and B may be layered, and the respective colors: R, G and B may be shown using a combination of a single color or two-color phosphor layer, color filters (color filter 17 in FIG. 15) and/or color converting filters.

Here, component members which are substantially the same as the component members in the display according to the first embodiment can be used in the display according to the present third embodiment except the component members that explains the characteristics.

In the following, an example of the manufacturing method for the display according to third embodiment is described. It is possible to use the same manufacturing method in a case where a phosphor layer made of another material is used, as described above.

(1) A glass substrate 10 is prepared.

(2) Next, a common electrode 15 is formed on the glass substrate 10 so as to cover the entire surface using Ta, for example. The film thickness is 200 nm.

(3) Next, a dielectric layer 18, such as of silicon nitride, is formed on the common electrode 15. Furthermore, openings corresponding to pixels are created and patterned in accordance with a photolithographic method, so that the common electrodes 15 are exposed.

(4) Next, scan wires 11 and gate electrodes 31 connected to the scan wires 11 are formed on the dielectric layer 18. Al is used for the scan wires 11, for example, and approximately parallel patterns are formed at predetermined intervals in accordance with a photolithographic method. The film thickness is 200 nm.

(5) Next, an insulating layer, such as of silicon nitride, is formed over the scan wires 11 as a gate insulating film 32 for TFT's 30. Furthermore, a pattern is formed for the gate insulating films 23 so as to match with the above described openings, and thus, the common electrode 15 is exposed.

(6) Next, an amorphous silicon layer for providing a switching function to the TFT's, for example, is layered on the gate insulating film 32, and furthermore, an N+ amorphous silicon layer is layered thereon, so that a pattern is formed.

(7) Next, a pattern for sources 33, drains 34 and pixel electrodes 14 connected to the drains 34 is formed using Ta, for example. The film thickness is 100 nm.

(8) Next, a pattern for an insulating layer of silicon nitride, for example, is formed as a protective layer 35, so that the pixel electrodes 14 are exposed. At the same time, the common electrode 15 is exposed through the above described openings.

(9) Next, a pattern for data wires 12 is formed using Al, for example. The data wires 12 are approximately parallel with predetermined intervals in between, and approximately perpendicular to the scan wires 11. The film thickness is 200 nm. Thus, an array substrate 40 is formed.

(10) Next, a phosphor layer 20 is formed on the array substrate 40. A powder of ZnS and $Cu_2S$ is put in a plurality of vaporization sources, and each material is irradiated with an electron beam in a vacuum (in the order of $10^{-6}$ Torr) so that the ZnS and $Cu_2S$ are vapor deposited together on the array substrate 40, and after that, an annealing process is carried out, so that a phosphor layer 20 having a polycrystal structure of ZnS and a segregated portion of $Cu_xS$ is obtained.

(11) Next, a transparent insulating layer, such as of silicon nitride, is formed over the common electrodes 15 as a protective layer (not shown), for example.

The display according to the present third embodiment can be obtained through the above described steps. In this display, the uniformity in the brightness within the surface is high in comparison with active matrix displays having a configuration of upper and lower electrodes where a common electrode is formed above the phosphor layer as a transparent electrode.

Here, the structure is not limited to the above, and appropriate modifications are possible; for example low temperature polysilicon, CG silicon or organic TFT's can be used for the TFT's 30, which are switching elements. In addition, it is also possible to provide a structure where each pixel is provided with a plurality of TFT's, so that the pixel selecting function and the drive function are separate. For example, one pixel may be formed of two TFT's: a drive TFT and a selection TFT, a capacitor provided between these, and a power supply wire connected to the source of the drive TFT. The pixel electrode 14 may be connected to the drain of the drive TFT. In this case, a signal voltage from the data wire 12 can be written into the capacitor when the selection TFT connected to the scan wire 11 is turned on, and at the same time, the drive TFT is turned on. The gate voltage of the drive TFT is determined in accordance with the signal voltage at that time, and a current corresponding to the conductance is supplied to the phosphor layer 20 from the current supply wire through the pixel electrode 14. Here, the structure is not limited to the above, and appropriate modifications are possible using publicly known drive technology for controlling the current or a technology for controlling middle tones.

Figure 16:
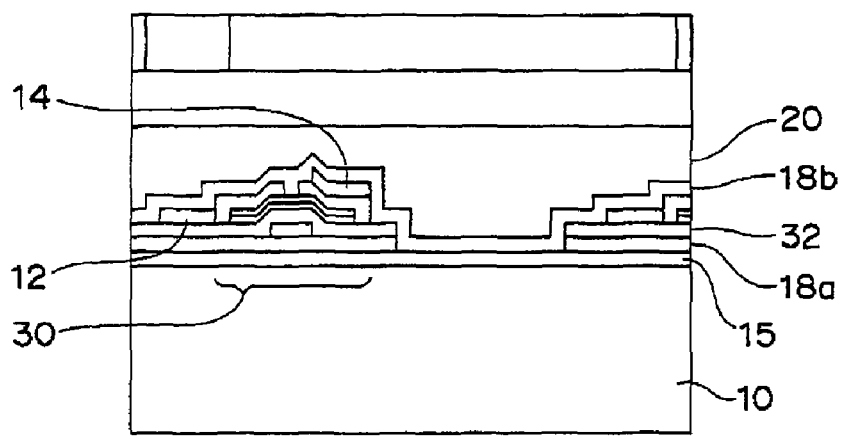
FIG. 16 is a schematic cross sectional diagram showing a modification of the display according to third embodiment of the present invention as viewed in the direction perpendicular to the light emitting surface.

In addition, appropriate modifications of the third embodiment are also possible; for example, a thin dielectric layer 18b may be formed over the pixel electrodes 14 and the common electrodes 15 for the drive with an alternating current, as shown in the schematic cross sectional diagram of FIG. 16. Furthermore, as with the modification of the second embodiment, any form may be used for the pixel electrodes 14 and the exposed portions of the common electrodes 15 in terms of the width, the length and the thickness, and may be in comb form with the comb portions interlocking.

Effects of the Invention

The display according to the present third embodiment uses a phosphor layer having low resistance, and thus makes light emission possible through conduction in the surface direction. As a result, the transparent electrode, for example of ITO, becomes unnecessary, and the display can be formed of only metal electrodes. The metal electrodes have a sufficiently low resistance, and therefore, highly bright light emission is possible, and the voltage can be prevented from dropping due to the resistance of the electrodes, and thus, the brightness within the surface and the uniformity in the color can be improved. Furthermore, the common electrode is formed so as to cover almost the entire surface, and therefore, has excellent release of Joule heat generated at the time of light emission, and thus, the brightness, color and the like can be prevented from becoming inconsistent due to the difference in the properties between pixels in terms of the temperature properties caused by the difference in temperature within the surface.

Fourth Embodiment

Outline of Configuration of Display

Figures 17A, 17B:
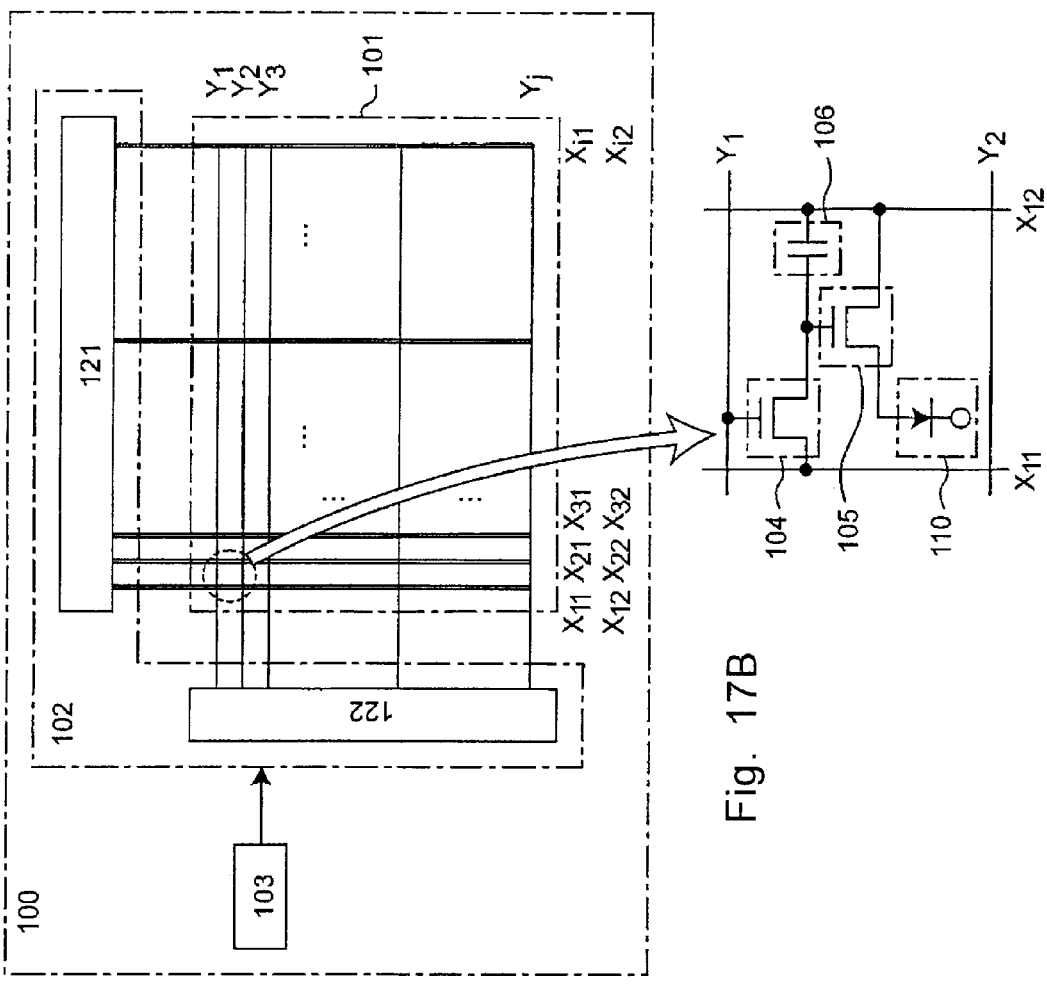
FIG. 17A is a schematic diagram showing the configuration of the display according to fourth embodiment of the present invention.
FIG. 17B is a schematic diagram showing the configuration of the pixels in the display portion of the display in FIG. 17A.

The display 100 according to fourth embodiment of the present invention is described in reference to FIGS. 17A and 17B. FIG. 17A is a block diagram schematically showing the configuration of the display 100 according to fourth embodiment. As shown in FIG. 17A, the display 100 is formed of a display portion 101 where a plurality of pixels are aligned two-dimensionally, a drive means 102 for selectively driving the pixels, and a power source 103 for driving for supplying power to the drive means 102. Here, in the present fourth embodiment, a direct current power source is used as the power source 103. In addition, the drive portion 102 is provided with a data electrode drive circuit 121 for driving data electrodes $X_{il}$ and a scan electrode drive circuit 122 for driving scan electrodes $Y_j$.

The display portion 101 is provided with an EL element array where pixels are two-dimensionally aligned in i columns×j rows, a plurality of data electrodes $X_{1l}, X_{2l}, X_{3l} \ldots X_{il}$ extending in a first direction parallel to the surface of the EL element array, a plurality of scan electrodes $Y_1, Y_2, Y_3 \ldots Y_j$ extending in a second direction perpendicular to the first direction, and a plurality of current supplying wires $X_{12}, X_{22}, X_{32} \ldots X_{i2}$ extending in a first direction parallel to the surface of the EL element array. One pixel is formed per intersection between the data electrodes $X_{il}$ and the scan electrodes $Y_j$.

FIG. 17B is a schematic diagram showing the configuration of the pixels in FIG. 17A. Each pixel is formed of a data electrode $X_{il}$, a scan electrode $Y_j$, a current supplying wire $X_{i2}$, a switching element 104 connected to the data electrode $X_{il}$ and the scan electrode $Y_j$, a current drive circuit 105, a capacitor 106 and an EL element 110. The capacitor 106 is connected to the switching element 104 and the current supplying wire $X_{i2}$. The current drive circuit 105 is connected to the switching element 104, the capacitor 106 and the EL element 110. That is to say, the display is an active matrix display.

When the switching element 104 is turned on, a signal voltage from the data wire $X_{11}$ is written into the capacitor 106, so that the gate voltage of the switching element is determined in accordance with the signal voltage at that time, and a current is supplied to the EL element 110 from the current supplying wire $X_{12}$ through the current drive element 105 in accordance with the conductivity.

<Wire Configuration of Display>

Figure 18:
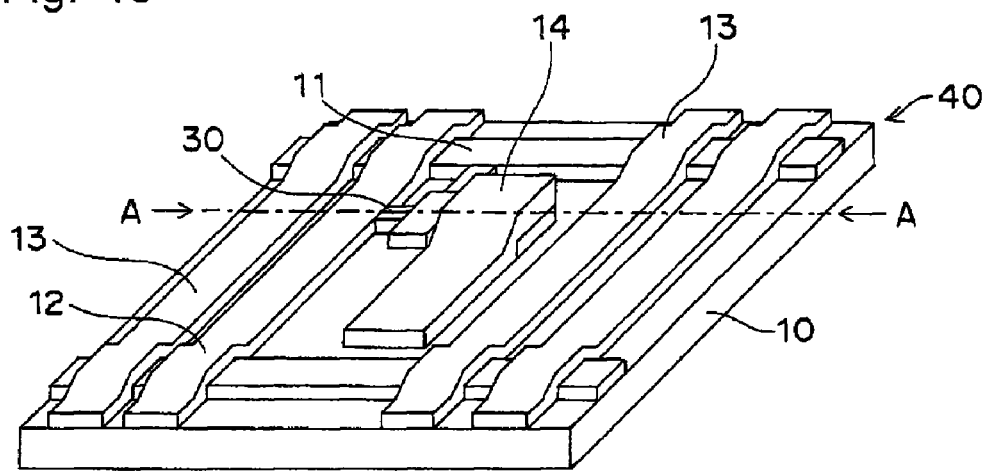
FIG. 18 is a schematic diagram showing the wires in the pixels of the display portion in the display according to fourth embodiment of the present invention.

FIG. 18 is a perspective diagram schematically showing the configuration of wires in a pixel of the display 100 according to the present fourth embodiment. This active matrix display 100 is provided with a plurality of scan wires 11 extending in a first direction parallel to the light emitting surface and a plurality of data wires 12 extending in a second direction parallel to the light emitting surface and perpendicular to the first direction. One thin film transistor 30 (hereinafter referred to as "TFT"), which is a switching element, is provided per intersection between the scan wires 11 and the data wires 12. In addition, the region surrounded by two adjacent scan wires 11 and two adjacent beta wires 12 is one pixel, and a plurality of pixels are aligned two-dimensionally. Each pixel is provided with at least one pixel electrode 14 and connected to a TFT 30. Furthermore, supply of a current is essential in EL elements, unlike with LCD's, and therefore, a power supplying wire 13 is provided so as to extend approximately parallel to the data wire 12. Here, a substrate 10 is provided to support the above described wires, electrodes and TFT 30, and the whole forms an array substrate 40.

<Cross Sectional Configuration of Display>

Figure 19:
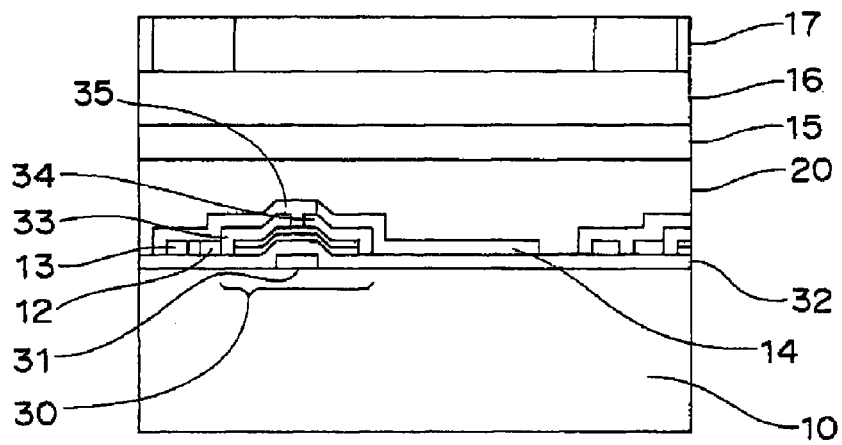
FIG. 19 is a schematic cross sectional diagram along line A-A in FIG. 18 as viewed in the direction perpendicular to the light emitting surface.
Figure 20:
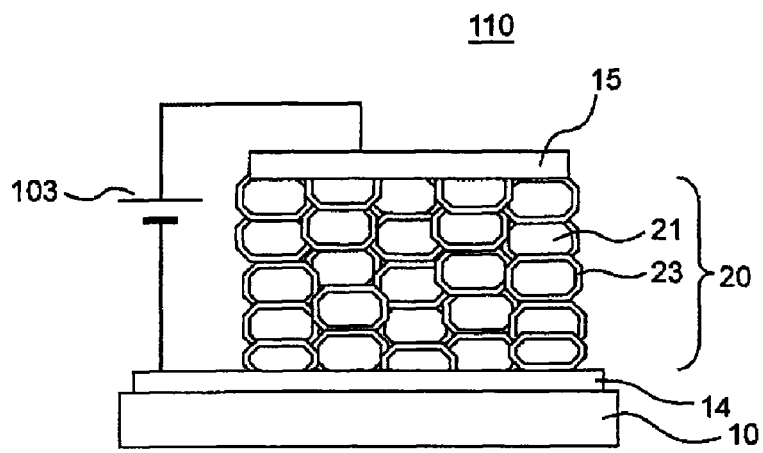
FIG. 20 is a schematic cross sectional diagram showing the EL element in the pixels.

In addition, FIG. 19 is a schematic cross sectional diagram along line A-A in FIG. 18 as viewed in the direction perpendicular to the light emitting surface. FIG. 20 is a schematic diagram showing the pixel in FIG. 19, which is regarded as one EL element 110. In this display, a phosphor layer 20 is formed approximately in a plane above the array substrate 40 made up of the substrate 10 and the above described wires and electrodes arranged on the substrate 10, so that the phosphor layer 20 forms a light emitting portion in the display 100. In addition, a common electrode 15 is formed above the phosphor layer 20. One schematic EL element 110 is formed in the pixel selected by the scan wire 11 and the data wire 12. This schematic EL element 110 is formed of a pixel electrode 14, a phosphor layer 20 and a common electrode 15, which are layered in this order on the substrate 10. In the EL element 110 formed in a pixel, there occurs a difference in potential between the pixel electrode 14 and the common electrode 15 when an external voltage is applied to the pixel electrode 14 via the TFT 30, for example a voltage from the direct current power source 103. When the difference in potential becomes the voltage for starting light emission or higher, a current flows through the phosphor layer 20 and light is emitted. The light is emitted to the outside through the surface on the side opposite to the array substrate 40.

Figure 21:
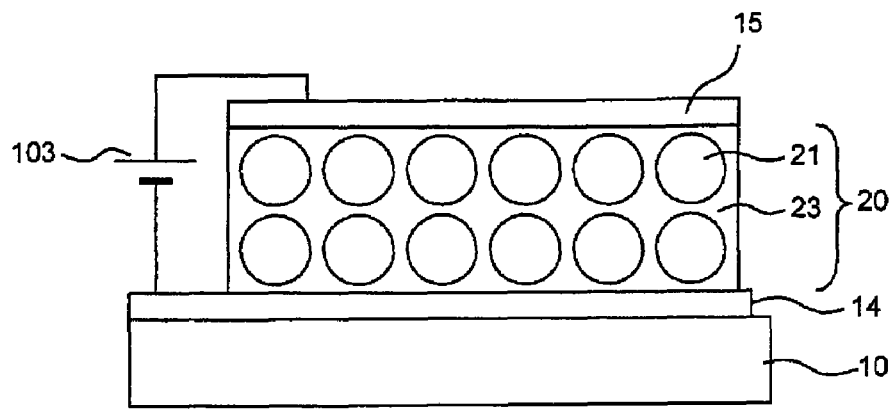
FIG. 21 is a schematic cross sectional diagram showing the EL element in the pixels in another example.

Furthermore, as shown in FIG. 20, this display 100 is characterized in that the phosphor layer 20 is formed of an aggregation of n type semiconductor grains 21, and a p type semiconductor 23 segregates between the grains. In addition, the EL element 110a in another example shown in FIG. 21 is characterized in that the phosphor layer 20 is formed of n type semiconductor grains 21 dispersed in a medium of the p type semiconductor 23. As described above, there are many interfaces between n type semiconductor grains and the p type semiconductor, and thus, the injection properties of holes are improved, so that light can be emitted efficiently through recombination of electrons and holes, and thus, an EL element 110 which emits highly bright light at a low voltage can be implemented. Furthermore, the n type semiconductor grains 21 are electrically connected to the electrodes via the p type semiconductor 23 in the configuration, so that the efficiency of light emission can be increased, and thus, a display which makes light emission possible at a low voltage and emits highly bright light can be obtained.

Here, the structure of the display 100 is not limited to the above, and various modifications are possible; for example, a plurality of phosphor layers 20 may be provided, all of the scan wires 11, data wires 12, pixel electrodes 14 and common electrodes 15 may be transparent electrodes, any one of the electrodes may be a black electrode, a structure for sealing part or the entirety of the display 100 may be additionally provided, or the structure for converting the color of light emitted from the phosphor layer 20 may be additionally provided in the front in the direction in which light is emitted. In addition, in a case of a color display, various modifications are possible; for example, the phosphor layer may be divided into different colors: R, G and B, light emitting units for the respective colors R, G and B may be layered, or R, G and B may be displayed separately through a combination of a single color or two color phosphor layer, a color filter (color filter 17 in FIG. 19), and/or a color converting filter (color converting layer 16 in FIG. 19).

Here, component members which are substantially the same as the component members in the display according to the first embodiment can be used in the display according to the present fourth embodiment except the component members that explain the characteristics.

<Phosphor Layer>

The phosphor layer 20 is sandwiched between the pixel electrodes 14 and the common electrodes 15, and has one of the following two structures:

(i) An aggregation of n type semiconductor grains having a structure where a p type semiconductor 23 segregates between the grains (structure shown in FIG. 20, for example). Here, the aggregation of n type semiconductor grains 21 forms a layer as it is.

(ii) A structure where n type semiconductor grains 21 are dispersed in a medium of a p type semiconductor 23 (structure shown in FIG. 21, for example).

Furthermore, it is preferable for the n type semiconductor grains 21 that form the phosphor layer 20 to be electrically connected to the pixel electrodes 14 and the common electrodes 15 via the p type semiconductor 23.

<Phosphor Material>

The material for the n type semiconductor grains 21 is an n type semiconductor material of which the majority carrier is electrons, and which exhibits n type conductivity. The material may be a compound semiconductor including an element in the twelfth group and an element in the sixteenth group. Alternatively, the material may be a compound semiconductor including an element in the thirteenth group and an element in the fifteenth group. Concretely, a material of which the optical band gap has a size for visible light, such as ZnS, ZnSe, GaN, InGaN, AlN, GaAlN, GaP, CdSe, CdTe, SrS or CaS is used for a matrix, and the matrix may be used as it is, or it may include one or more types of atoms or ions selected from the group consisting of Cu, Ag, Au, Ir, Al, Ga, In, Mn, Cl, Br, I, Li, Ce, Pr, Nd, Pm, Sm, Eu, Gd, Tb, Dy, Ho, Er, Tm and Yb as an additive. The color of light emitted from the phosphor layer 20 is determined by the element.

Meanwhile, the material for the p type semiconductor 23 is a p type semiconductor material of which the majority carrier is holes, and which exhibits p type conductivity. This p type semiconductor material may be a compound, such as $Cu_2S$, ZnS, ZnSe, ZnSSe, ZnSeTe or ZnTe, or a nitride, such as GaN or InGaN. From among the materials for the p type semiconductor, $Cu_2S$, for example, inherently have p type conductivity, while other materials must be used together with an additive; that is, with one or more elements selected from among nitrogen, Ag, Cu and In. In addition, a chalcopyrite type compound having p type conductance, such as $CuGaS_2$ or $CuAlS_2$, may be used as the p type semiconductor 23.

A sintering method, a vapor synthesizing method, an explosion method, a water heat synthesizing method, a high temperature, high pressure synthesizing method, a flux method or a coprecipitation method can be used as the manufacturing method for the semiconductor.

Figure 33:
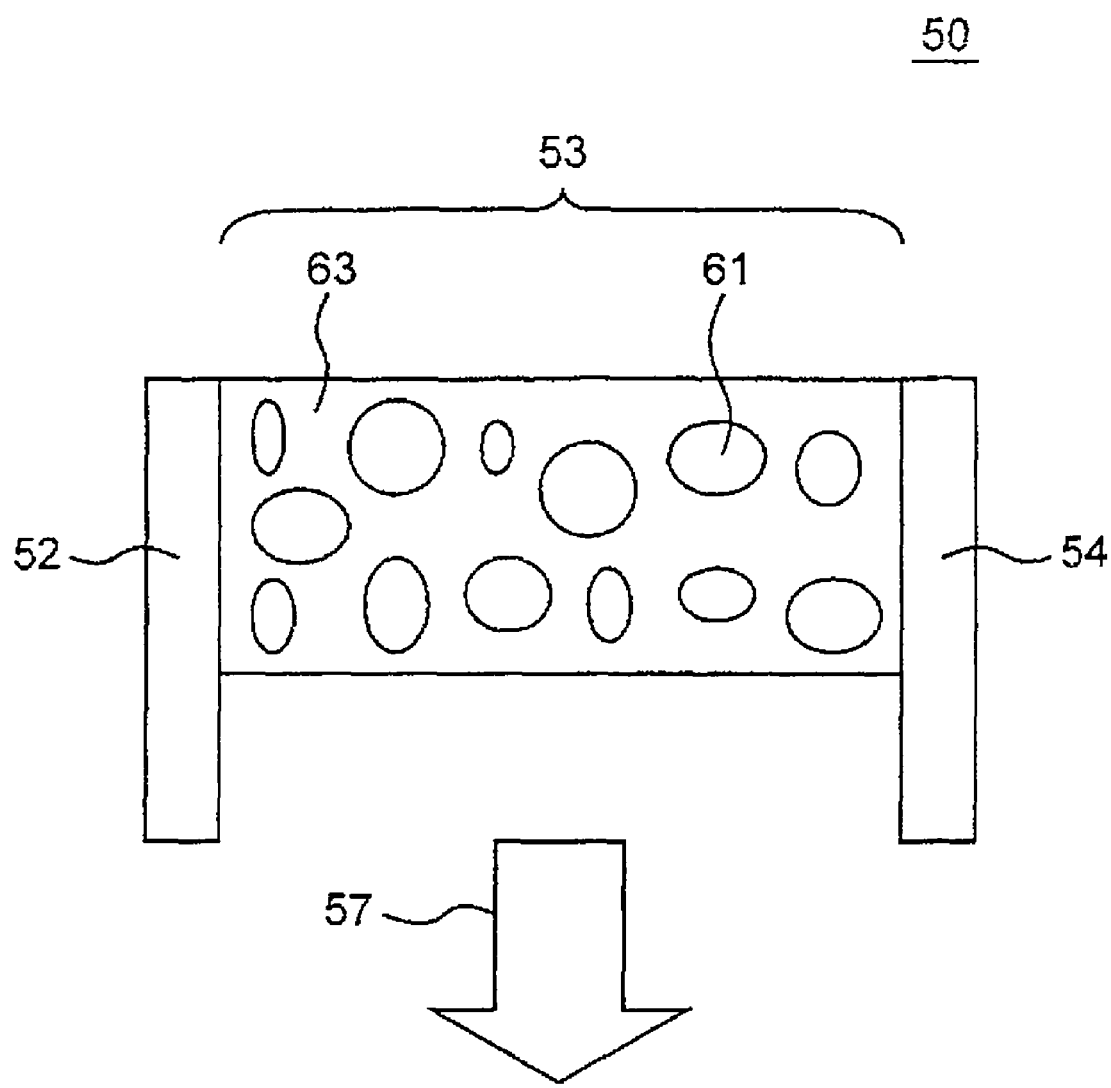
FIG. 33 is a schematic diagram showing the configuration of a conventional inorganic EL element as viewed in the direction perpendicular to the light emitting surface.

The display device 100 according to the present fourth embodiment is characterized in that the phosphor layer 20 has either (i) a structure where a p type semiconductor 23 segregates between n type semiconductor grains 21 (FIG. 20), or (ii) a structure where n type semiconductor grains 21 are dispersed in a medium of a p type semiconductor 23 (FIG. 21). As with the related art shown in FIG. 33, in a case where the medium that is electrically connected to the semiconductor grains 61 is indium tin oxide 63, light emission becomes possible when electrons reach the semiconductor grains 61, and the density of the holes in the indium tin oxide is low, and therefore, holes for recombination run short. Accordingly, highly bright light emission through recombination of electrons and holes cannot be expected. Therefore, the present inventors focused on the structure which allows holes to be efficiently injected into the phosphor layer together with electrons, in order to achieve particularly bright, efficient and continuous light emission. In order to implement the above described structure, it is necessary for a great number of holes to reach the inside or the interface between grains in the phosphor material, and furthermore, it is necessary for holes to be injected rapidly from the electrode facing the electrode for injecting electrons, and reach the grains or the interface in the phosphor material. As a result of diligent research, the present inventors found that holes can be efficiently injected into n type semiconductor grains 21, or in the interface, together with electrons by providing either the above described (i) or (ii) as the structure of the phosphor layer 20. That is to say, phosphor layers 20 having one of the above described structures allow electrons injected through one electrode to pass through the p type semiconductor 23 and reach the n type semiconductor grains 21, and allow a large number of holes to reach the grains in the phosphor material from the other electrode, so that light can be efficiently emitted through recombination of electrons and holes. As a result, a display which emits highly bright light at a low voltage can be implemented, and thus, the present invention can be achieved. In addition, the introduction of a donor or an acceptor also makes recombination of free electrons and holes captured by the acceptor, recombination of free holes and electrons captured by the donor, and light emission through a combination of the donor and the acceptor possible. Furthermore, light emission through energy transfer is also possible, when another type of ion is in the vicinity.

In the following, an example of the manufacturing method for the display 100 according to fourth embodiment is described. It is possible to use the same manufacturing method in a case where a phosphor layer made of another material is used, as described above.

(1) A glass substrate 10 is prepared.
(2) Scan wires 11 and gate electrodes 31 connected to the scan wires 11 are formed on the substrate 10. Al is used, for example, and approximately parallel patterns are formed at predetermined intervals in accordance with a photolithographic method. The film thickness is 200 nm.
(3) An insulating layer, such as of silicon nitride, is formed over the scan wires 11 as a gate insulating film 32 for TFT's 30.
(4) An amorphous silicon layer for providing a switching function to the TFT's 30, for example, is layered on the insulating layer 32, and furthermore, an N+ amorphous silicon layer is layered thereon, so that a pattern is formed.
(5) Next, a pattern for sources 33, drains 34 and pixel electrodes 14 connected to the drains 34 is formed using Ta, for example. The film thickness is 100 nm.
(6) Furthermore, a pattern for data wires 12 and current supply wires 13 is formed using Al, for example. The data wires 12 and the current supply wires 13 are approximately parallel with predetermined intervals in between, and approximately perpendicular to the scan wires 11. The film thickness is 200 nm.
(7) Next, a pattern for an insulating layer, such as of silicon nitride, is formed as a protective layer 35, so that the pixel electrodes 14 are exposed. Thus, an array substrate 40 is formed.
(8) A phosphor layer 20 is formed on the substrate 10 in the following manner. First, a powder of ZnS and $Cu_2S$ is put in a plurality of vaporization sources, and each material is irradiated with an electron beam in a vacuum (in the order of $10^{-6}$ Torr) so that a phosphor layer 20 is formed as a film on the substrate 10. At this time, the temperature of the substrate is 200° C., and ZnS and $Cu_2S$ are vapor deposited together.
(9) After the film formation for the phosphor layer 20, the film is sintered for approximately one hour at 700° C. in a sulfur atmosphere. When this film is observed through X-ray diffraction or using an SEM, a polycrystal structure with microscopic ZnS crystal grains and segregated portions of $Cu_xS$ can be seen. Although the details are not clear, it is believed that phases of ZnS and $Cu_xS$ separate and the segregated structures are formed.
(10) In addition, a pattern for common electrodes 15 is formed using ITO, for example. The film thickness is 200 nm.
(11) Furthermore, a transparent insulating layer, such as of silicon nitride, is formed over the common electrodes 15 as a protective layer (not shown), for example.

The display 100 according to the present fourth embodiment can be obtained through the above described steps. The light emitted from this display 100 is highly bright when operated at a voltage of as low as approximately 5 V to 10 V.

Here, the structure is not limited to the above, and appropriate modifications are possible; for example low temperature polysilicon, CG silicon or organic TFT's can be used for the TFT's 30, which are switching elements. In addition, it is also possible to provide a structure where each pixel is provided with a plurality of TFT's, so that the pixel selecting function and the drive function are separate. For example, one pixel may be formed of two TFT's: a drive TFT and a selection TFT, a capacitor provided between these, and a power supply wire connected to the source of the drive TFT. The pixel electrode may be connected to the drain of the drive TFT. In this case, a signal voltage from the data wire can be written into the capacitor when the selection TFT connected to the scan wire is turned on, and at the same time, the drive TFT is turned on. The gate voltage of the drive TFT is determined in accordance with the signal voltage at that time, and a current corresponding to the conductance is supplied to the phosphor layer from the current supply wire through the pixel electrode. Here, the structure is not limited to the above, and appropriate modifications are possible using publicly known drive technology for controlling the current or a technology for controlling middle tones.

In addition, the phosphor layer may be formed of films of fluorescent bodies for different colors in a case of a color display. Alternatively, light emitting units for the respective colors: R, G and B, may be layered so as to provide transparent electrode/phosphor layer/rear electrode. Furthermore, in another example for a color display a display having a single color or two-color phosphor layer may be fabricated, and after that the respective colors: R, G and B may be shown using color filters and/or color converting filters.

Figure 22:
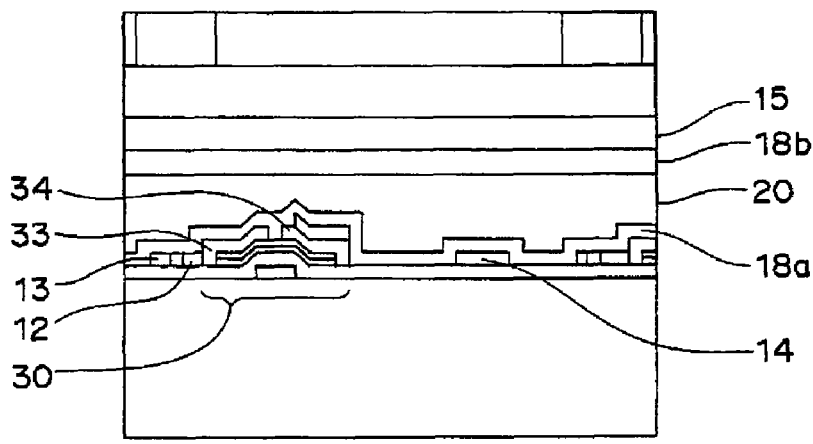
FIG. 22 is a schematic cross sectional diagram showing a modification of the display according to fourth embodiment of the present invention as viewed in the direction perpendicular to the light emitting surface.
Figure 23:
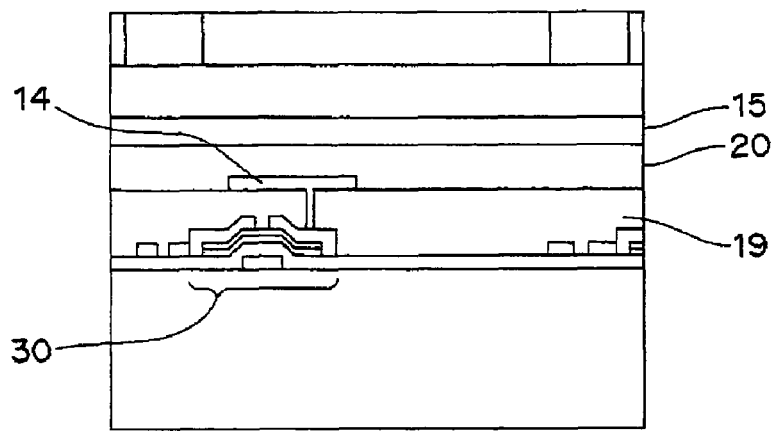
FIG. 23 is a schematic cross sectional diagram showing another modification of the display according to fourth embodiment of the present invention as viewed in the direction perpendicular to the light emitting surface.

In addition, appropriate modifications of fourth embodiment are also possible; for example, a protective dielectric film 18 is formed on the pixel electrodes 14, and furthermore, a thin dielectric layer 18b is formed beneath the common electrodes 15 for drive with an alternating current as shown in the schematic cross sectional diagram of FIG. 22, or, as shown in the schematic cross sectional diagram of FIG. 23, a flattened dielectric layer 19 is formed, and pixel electrodes 14 are formed on the flattened dielectric layer 19 so as to be connected to the drains 34 through contact holes.

Effects of the Invention

The display according to the present fourth embodiment uses a phosphor layer having high efficiency for light emission, and thus makes it possible to emit light with higher brightness when driven at a lower voltage than in the related art.

Fifth Embodiment

Outline of Configuration of Display

Figure 24:
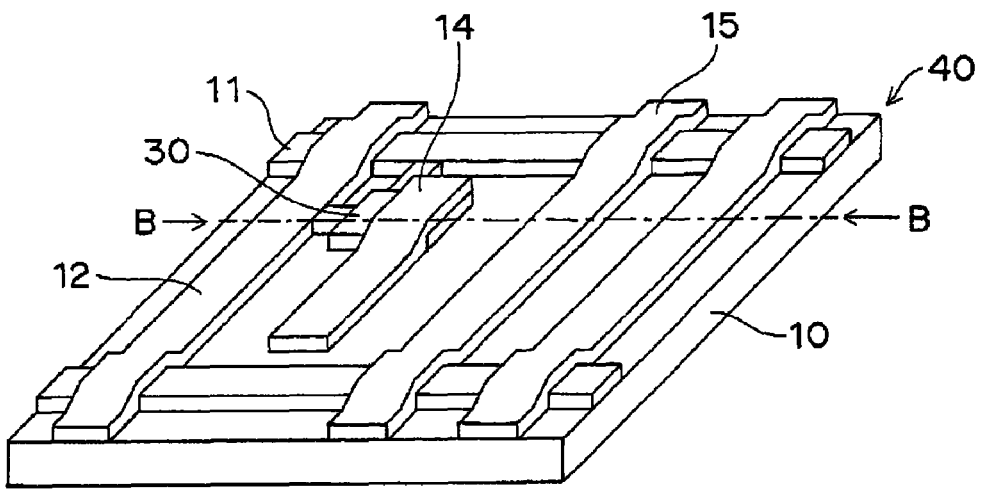
FIG. 24 is a schematic diagram showing the wires in the pixels of the display portion in the display according to fifth embodiment of the present invention.
Figure 25:
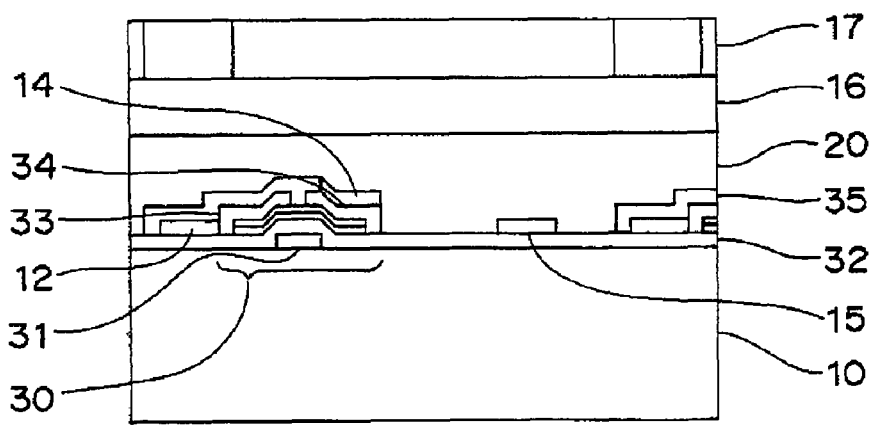
FIG. 25 is a schematic cross sectional diagram along line B-B in FIG. 24 as viewed in the direction perpendicular to the light emitting surface.

FIG. 24 is a plan diagram schematically showing the configuration of wires in the pixels of the display according to the present fifth embodiment. In addition, FIG. 25 is a cross sectional diagram along line B-B in FIG. 24 schematically showing the structure as viewed in the direction perpendicular to the light emitting surface. This active matrix display 10 is provided with a plurality of scan wires 11 extending in a first direction parallel to the light emitting surface and a plurality of data wires 12 extending parallel to the light emitting surface in a second direction perpendicular to the first direction. Thin film transistors 30 (hereinafter referred to as "TFT's"), which are switching elements, are provided at the intersections between the scan wires 11 and the data wires 12.

In addition, a region surrounded by two adjacent scan wires 11 and two adjacent data wires 12 is one pixel, and a plurality of pixels are aligned two-dimensionally. Each pixel is provided with at least one pixel electrode 14 that is connected to a TFT 30. Furthermore, at least one common electrode 15 is provided to make a pair with each electrode 14, and the common electrodes 15 extend approximately parallel to the data wires 12. A substrate 10 is provided so as to support these wires, electrodes and TFT's 30, and thus, an array substrate 40 is formed. Furthermore, an approximately flat phosphor layer 20 is formed on the array substrate 40 so as to form a light emitting portion in the display 100. When an external voltage is applied to the pixel electrode 14 via the TFT 30 in a pixel selected by a scan wire 11 and a data wire 12, there occurs a difference in potential between the pixel electrode 14 and the common electrode 15. When the difference in potential becomes of a light emission starting voltage or higher, a current flows through the phosphor layer 20 and light is emitted. Light is emitted to the outside from the phosphor layer 20 through the surface on the side opposite to the array substrate 40.

This display 100 has a structure where the pixel electrodes 14 and the common electrodes 15 are provided approximately on the same side of the phosphor layer 20. The resistivity of the phosphor layer 20 is in a semiconductor region, and thus, a current flows at a low voltage, and light is emitted in the above configuration. In addition, this configuration does not require a transparent electrode, and wires and electrodes can be formed of a metal material having a sufficiently low resistance, and therefore, the voltage can be prevented from dropping due to the resistance of the transparent electrode. Here, the configuration is not limited to the above, and the common electrodes 15 may extend approximately parallel to the scan electrodes 11. In addition, various modifications are possible; for example the pixel electrodes 14 and the common electrodes 15 may be black electrodes, such a structure that part or the entirety of the display is sealed for protection (not shown) may be additionally provided, and a structure for converting the color of light emitted from the phosphor layer 20 toward the front relative to the direction in which light is emitted (color converting layer 16 in FIG. 25) may be further provided. In addition, various modifications are also possible for the color display; for example the phosphor layer may be divided into different colors: R, G and B, light emitting units for the respective colors: R, G and B may be layered, and the respective colors: R, G and B may be shown using a combination of a single color or two-color phosphor layer, color filters (color filter 17 in FIG. 25) and/or color converting filters.

Here, component members which are substantially the same as the component members in the display according to the fourth embodiment can be used in the display according to the present fifth embodiment except the component members that explain the characteristics.

In the following, an example of the manufacturing method for the display according to the fifth embodiment is described. It is possible to use the same manufacturing method in a case where a phosphor layer 20 made of another material is used, as described above.

(1) A glass substrate 10 is prepared.
(2) Scan wires 11 and gate electrodes 31 connected to the scan wires 11 are formed on the glass substrate 10. Al is used, for example, and approximately parallel patterns are formed at predetermined intervals in accordance with a photolithographic method. The film thickness is 200 nm.

(3) An insulating layer, such as of silicon nitride, is formed over the scan wires 11 as a gate insulating film 32 for TFT's 30.
(4) An amorphous silicon layer for providing a switching function to the TFT's 30, for example, is layered on the insulating layer, and furthermore, an N+ amorphous silicon layer is layered thereon, so that a pattern is formed.
(5) Next, a pattern for sources 33, drains 34 and pixel electrodes 14 connected to the drains 34 is formed using Ta, for example. The film thickness is 100 nm.
(6) Furthermore, a pattern for an insulating layer, such as of silicon nitride, is formed as a protective layer 35, so that the pixel electrodes 14 are exposed.
(7) Next, a pattern for data wires 12 and common electrodes 15 is formed using Al, for example. The data wires 12 are approximately parallel with predetermined intervals in between, and approximately perpendicular to the scan wires 11. In addition, the common electrodes 15 are formed between adjacent data wires 12 and pixel electrodes 15 and approximately parallel to the data wires 12. The film thickness is 200 nm. Thus, an array substrate 40 is formed.
(8) Next, a phosphor layer 20 is formed on the array substrate 40. First, a powder of ZnS and Cu$_2$S is put in a plurality of vaporization sources, and each material is irradiated with an electron beam in a vacuum (in the order of $10^{-6}$ Torr) so that a phosphor layer 20 is formed as a film on the substrate 10. At this time, the temperature of the substrate is 200° C., and ZnS and Cu$_2$S are vapor deposited together.
(9) After the film formation for the phosphor layer 20, the film is sintered for approximately one hour at 700° C. in a sulfur atmosphere. When this film is observed through X-ray diffraction or using an SEM, a polycrystal structure with microscopic ZnS crystal grains and segregated portions of Cu$_X$S can be seen.
(10) Furthermore, a transparent insulating layer, such as of silicon nitride, is formed over the phosphor layer 20 as a protective layer (not shown), for example.

The display according to the present fifth embodiment can be obtained through the above described steps. In this display, uniformity in the brightness within the surface is high in comparison with the active matrix display having a configuration of upper and lower electrodes, where the common electrodes are transparent electrodes formed above the phosphor layer.

Here, the structure is not limited to the above, and appropriate modifications are possible; for example low temperature polysilicon, CG silicon or organic TFT's can be used for the TFT's 30, which are switching elements. In addition, it is also possible to provide a structure where each pixel is provided with a plurality of TFT's, so that the pixel selecting function and the drive function are separate. For example, one pixel may be formed of two TFT's: a drive TFT and a selection TFT, a capacitor provided between these, and a power supply wire connected to the source of the drive TFT. The pixel electrode 14 may be connected to the drain of the drive TFT. In this case, a signal voltage from the data wire 12 can be written into the capacitor when the selection TFT connected to the scan wire 11 is turned on, and at the same time, the drive TFT is turned on. The gate voltage of the drive TFT is determined in accordance with the signal voltage at that time, and a current corresponding to the conductance is supplied to the phosphor layer 20 from the current supply wire through the pixel electrode 14. Here, the structure is not limited to the above, and appropriate modifications are possible using publicly known drive technology for controlling the current or a technology for controlling middle tones.

Figure 26:
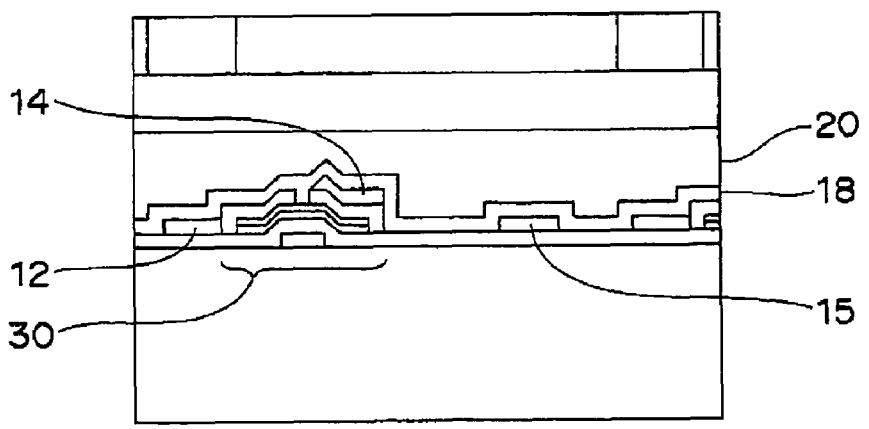
FIG. 26 is a schematic cross sectional diagram showing a modification of the display according to fifth embodiment of the present invention as viewed in the direction perpendicular to the light emitting surface.
Figure 27:
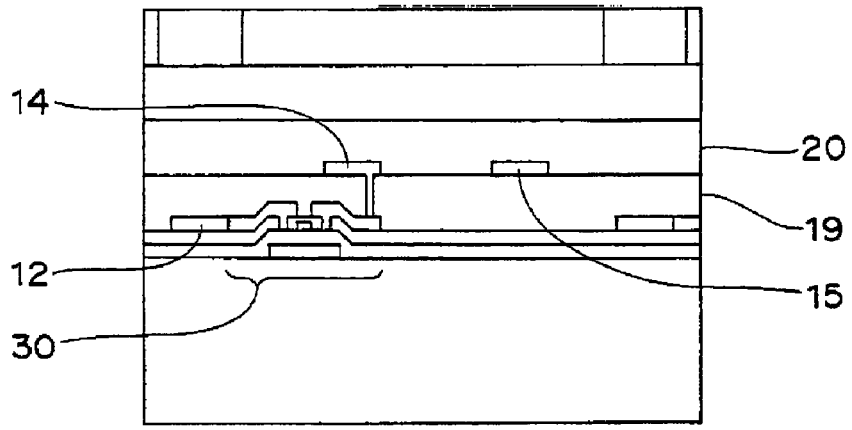
FIG. 27 is a schematic cross sectional diagram showing another modification of the display according to fifth embodiment of the present invention as viewed in the direction perpendicular to the light emitting surface.
Figure 28:
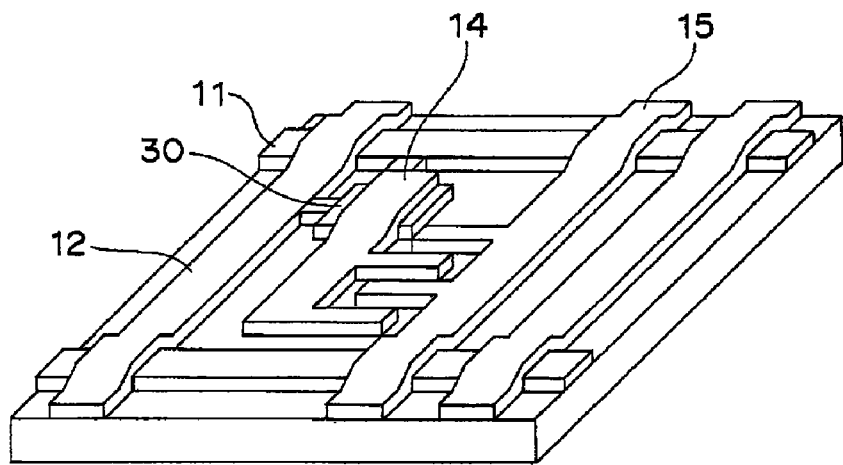
FIG. 28 is a perspective diagram schematically showing the wires in the pixels of the display portion in still another modification of the display according to fifth embodiment of the present invention.
Figure 29:
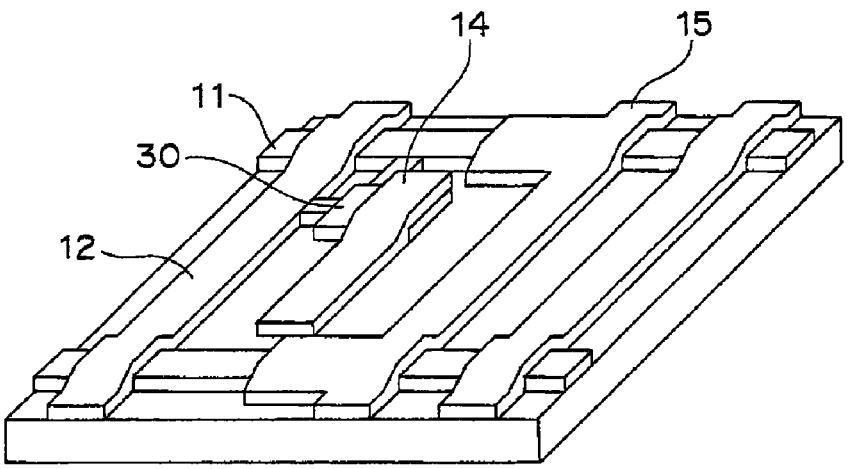
FIG. 29 is a perspective diagram schematically showing the wires in the pixels of the display portion in yet another modification of the display according to fifth embodiment of the present invention.

In addition, appropriate modifications of fifth embodiment are also possible; for example, a thin dielectric layer 18 may be formed over the pixel electrodes 14 and the common electrodes 15 for the drive with an alternating current, as shown in the schematic cross sectional diagram of FIG. 26, and a flattened dielectric layer 19 may be formed and the pixel electrodes 14 and the common electrodes 15 formed via contact holes, as shown in the schematic cross sectional diagram of FIG. 27. Furthermore, any form is possible for the pixel electrodes 14 and the common electrodes 15 in terms of the width, the length and the thickness. As shown in the perspective diagram of FIG. 28, for example, the pixel electrodes 14 and the common electrodes 15 are in comb form, and the comb portions interlock. As a result, uniform light emission can be achieved without specifying a conductive path between the pixel electrodes 14 and the common electrodes 15. In addition, as shown in the perspective diagram of FIG. 29, the width of the common electrode 15 may be greater in a non-pixel region. The width of the common electrodes 15 in a direction perpendicular to the direction in which the common electrodes 15 extend may be greater along the gate wires 11. As a result, the effects of heat release from the common electrodes 15 toward the gate electrodes 11 can be improved.

Effects of the Invention

In the direct current drive type inorganic EL element according to the present inventors, the phosphor layer has a resistivity in the semiconductor region. In order to apply this direct current drive type inorganic EL element to a display having a matrix structure, there are cases where a transparent electrode is used in order to emit light in the direction of the film thickness, and the present inventors noticed a problem in practical use, such that the voltage drop resulting from the resistance of the transparent electrode is great. The phosphor layer of the direct current drive inorganic EL elements has a low resistance, and thus, the present inventors found that light emission is possible through conduction of the phosphor layer 20 in the surface direction, and thus, the configuration of the display according to the present fifth embodiment can be implemented. Light can be emitted through conduction in the surface direction of the phosphor layer 20 having a low resistance in the display according to the present fifth embodiment. As a result, the transparent electrode, for example of ITO, becomes unnecessary, and the display can be formed of only metal electrodes. The metal electrodes have a sufficiently low resistance, and therefore, highly bright light emission is possible, and the voltage can be prevented from dropping due to the resistance of the electrodes, and thus, the brightness within the surface and the uniformity in the color can be improved.

Sixth Embodiment

Outline of Configuration of Display

Figure 30:
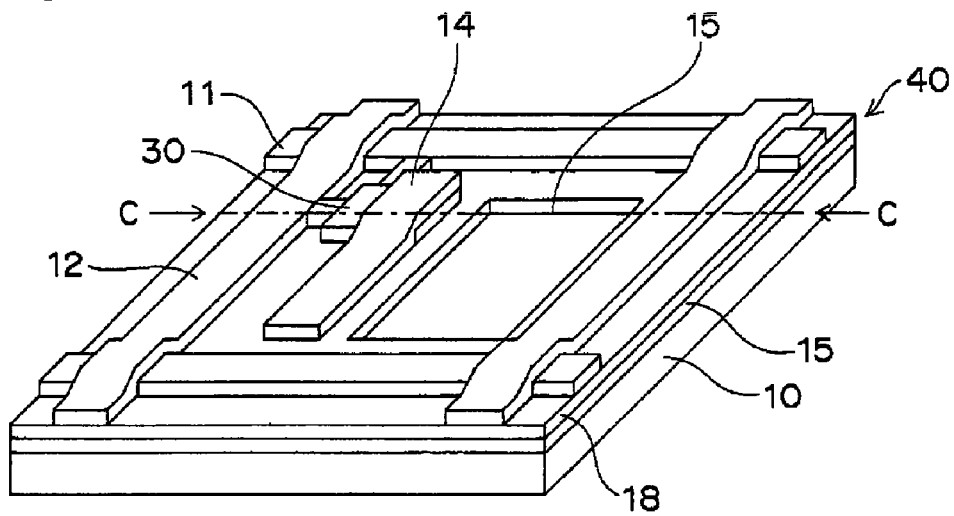
FIG. 30 is a schematic diagram showing the wires in the pixels of the display portion in the display according to sixth embodiment of the present invention.
Figure 31:
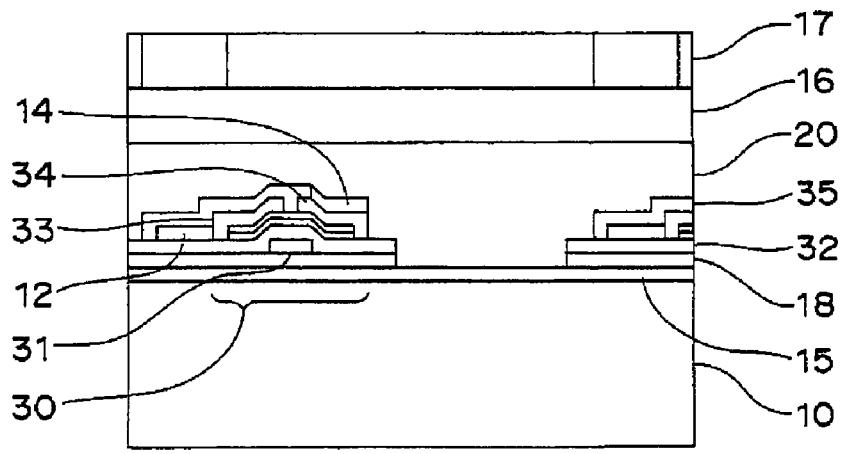
FIG. 31 is a schematic cross sectional diagram along line C-C in FIG. 30 as viewed in the direction perpendicular to the light emitting surface.

FIG. 30 is a plan diagram schematically showing the configuration of wires in the pixels of the display according to the present sixth Embodiment. In addition, FIG. 31 is a cross sectional diagram along line C-C in FIG. 30 as viewed in the direction perpendicular to the light emitting surface. This active matrix display is provided with a plurality of scan wires 11 extending in a first direction parallel to the light emitting surface and a plurality of data wires 12 extending parallel to the light emitting surface in a second direction perpendicular to the first direction. Thin film transistors 30 (hereinafter referred to as "TFT's"), which are switching elements, are provided at the intersections between the scan wires 11 and the data wires 12. In addition, a region surrounded by two adjacent scan wires 11 and two adjacent data wires 12 is one pixel, and a plurality of these pixels are aligned two-dimensionally. Each pixel is provided with at least one pixel electrode 14 that is connected to a TFT 30. Furthermore, a common electrode 15 is provided to make a pair with each pixel electrode 14, the common electrode 15 covering approximately the entire surface. The common electrodes 15 are provided so as to be electrically isolated from the wires, electrodes and TFT's 30 by means of the dielectric layer 18. The dielectric layer 18 has at least one opening per pixel, through which the common electrodes 15 in the lower layer are exposed. Furthermore, a substrate 10 is provided so as to support these wires, electrodes and TFT's 30, and thus, an array substrate 40 is formed. Furthermore, an approximately flat phosphor layer 20 is formed on the array substrate 40 so as to form a light emitting portion in the display. When an external voltage is applied to the pixel electrode 14 via the TFT 30 in a pixel selected by a scan wire 11 and a data wire 12, there occurs a difference in potential between the pixel electrode 14 and the common electrode 15. When the difference in potential becomes of a light emission starting voltage or higher, a current flows through the phosphor layer 20 and light is emitted. Light is emitted to the outside from the phosphor layer 20 through the surface on the side opposite to the array substrate 40.

This display 100 has a structure where the pixel electrodes 14 and the common electrodes 15 are provided approximately on the same side of the phosphor layer 20. The resistivity of the phosphor layer 20 is in a semiconductor region, and thus, a current flows at a low voltage, and light is emitted in the above configuration. In addition, this configuration does not require a transparent electrode, and wires and electrodes can be formed of a metal material having a sufficiently low resistance, and therefore, the voltage can be prevented from dropping due to the resistance of the transparent electrode. Here, the configuration is not limited to the above, and the common electrodes 15 may extend approximately parallel to the scan electrodes 11. In addition, various modifications are possible; for example the pixel electrodes 14 and the common electrodes 15 may be black electrodes, such a structure that part or the entirety of the display is sealed for protection (not shown) may be additionally provided, and a structure for converting the color of light emitted from the phosphor layer 20 toward the front relative to the direction in which light is emitted (color converting layer 16 in FIG. 31) may be further provided. In addition, various modifications are also possible for the color display; for example the phosphor layer may be divided into different colors: R, G and B, light emitting units for the respective colors: R, G and B may be layered, and the respective colors: R, G and B may be shown using a combination of a single color or two-color phosphor layer, color filters (color filter 17 in FIG. 31) and/or color converting filters.

Here, component members which are substantially the same as the component members in the display according to the fourth embodiment can be used in the display according to the present sixth embodiment except the component that explain the characteristics.

In the following, an example of the manufacturing method for the display according to the sixth embodiment is described. It is possible to use the same manufacturing method in a case where a phosphor layer made of another material is used, as described above.

(1) A glass substrate 10 is prepared.
(2) Next, a common electrode 15 is formed on the glass substrate 10 so as to cover the entire surface using Ta, for example. The film thickness is 200 nm.
(3) A dielectric layer 18, such as of silicon nitride, is formed on the common electrode 15. Furthermore, openings corresponding to pixels are created and patterned in accordance with a photolithographic method, so that the common electrodes 15 are exposed.
(4) In addition, scan wires 11 and gate electrodes 31 connected to the scan wires 11 are formed on the dielectric layer 18. Al is used for the scan wires 11, for example, and approximately parallel patterns are formed at predetermined intervals in accordance with a photolithographic method. The film thickness is 200 nm.
(5) Furthermore, an insulating layer, such as of silicon nitride, is formed over the scan wires 11 as a gate insulating film 32 for TFT's 30. Furthermore, a pattern is formed for the gate insulating films 23 so as to match with the above described openings, and thus, the common electrode 15 is exposed.
(6) Next, an amorphous silicon layer for providing a switching function to the TFT's, for example, is layered on the gate insulating film 32, and furthermore, an N+ amorphous silicon layer is layered thereon, so that a pattern is formed.
(7) After that, a pattern for sources 33, drains 34 and pixel electrodes 14 connected to the drains 34 is formed using Ta, for example. The film thickness is 100 nm.
(8) Next, a pattern for an insulating layer of silicon nitride, for example, is formed as a protective layer 35, so that the pixel electrodes 14 are exposed. At the same time, the common electrode 15 is exposed through the above described openings.
(9) In addition, a pattern for data wires 12 is formed using Al, for example. The data wires 12 are approximately parallel with predetermined intervals in between, and approximately perpendicular to the scan wires 11. The film thickness is 200 nm. Thus, an array substrate 40 is formed.
(10) Furthermore, a phosphor layer 20 is formed on the array substrate 40. A powder of ZnS and $Cu_2S$ is put in a plurality of vaporization sources, and each material is irradiated with an electron beam in a vacuum (in the order of $10^{-6}$ Torr) so that a phosphor layer 20 is formed on the substrate 10 as a film. At this time, the temperature of the substrate is 20° C., and the ZnS and $Cu_2S$ are vapor deposited together.
(11) After the film formation for the phosphor layer 20, the film is sintered for approximately one hour at 700° C. in a sulfur atmosphere. When this film is observed through X-ray diffraction or using an SEM, a polycrystal structure with microscopic ZnS crystal grains and segregated portions of $Cu_xS$ can be seen.
(12) After that, a transparent insulating layer, such as of silicon nitride, is formed over the common electrodes 15 as a protective layer (not shown), for example.

The display according to the present sixth embodiment can be obtained through the above described steps. In this display, the uniformity in the brightness within the surface is high in comparison with active matrix displays having a configuration of upper and lower electrodes where a common electrode is formed above the phosphor layer as a transparent electrode.

Here, the structure is not limited to the above, and appropriate modifications are possible; for example low temperature poly-silicon, CG silicon or organic TFT's can be used for the TFT's 30, which are switching elements. In addition, it is also possible to provide a structure where each pixel is provided with a plurality of TFT's, so that the pixel selecting function and the drive function are separate. For example, one pixel may be formed of two TFT's: a drive TFT and a selection TFT, a capacitor provided between these, and a power supply wire connected to the source of the drive TFT. The pixel electrode 14 may be connected to the drain of the drive TFT. In this case, a signal voltage from the data wire 12 can be written into the capacitor when the selection TFT connected to the scan wire 11 is turned on, and at the same time, the drive TFT is turned on. The gate voltage of the drive TFT is determined in accordance with the signal voltage at that time, and a current corresponding to the conductance is supplied to the phosphor layer 20 from the current supply wire through the pixel electrode 14. Here, the structure is not limited to the above, and appropriate modifications are possible using publicly known drive technology for controlling the current or a technology for controlling middle tones.

Figure 32:
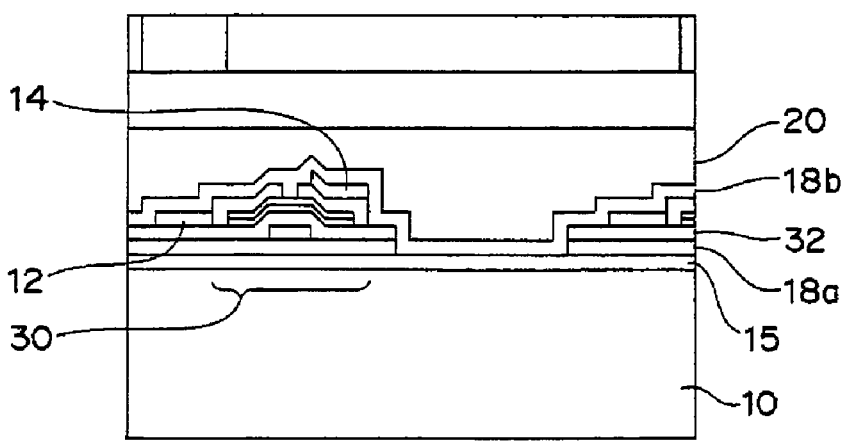
FIG. 32 is a schematic cross sectional diagram showing a modification of the display according to sixth embodiment of the present invention as viewed in the direction perpendicular to the light emitting surface.

In addition, appropriate modifications of the sixth embodiment are also possible; for example, a thin dielectric layer 18b may be formed over the pixel electrodes 14 and the common electrodes 15 for the drive with an alternating current, as shown in the schematic cross sectional diagram of FIG. 32. Furthermore, as with the modification of fifth embodiment, any form may be used for the pixel electrodes 14 and the exposed portions of the common electrodes 15 in terms of the width, the length and the thickness, and may be in comb form with the comb portions interlocking.

Effects of the Invention

The display according to the present sixth embodiment uses a phosphor layer having low resistance, and thus makes light emission possible through conduction in the surface direction of the phosphor layer. As a result, the transparent electrode, for example of ITO, becomes unnecessary, and the display can be formed of only metal electrodes. The metal electrodes have a sufficiently low resistance, and therefore, highly bright light emission is possible, and the voltage can be prevented from dropping due to the resistance of the electrodes, and thus, the brightness within the surface and the uniformity in the color can be improved. Furthermore, the common electrode is formed so as to cover almost the entire surface, and therefore, has excellent release of Joule heat generated at the time of light emission, and thus, the brightness, color and the like can be prevented from becoming inconsistent due to the difference in the properties between pixels in terms of the temperature properties caused by the difference in temperature within the surface.

In the display according to the present invention, images with high brightness can be obtained when the display is driven at a low voltage, and thus, a display having excellent uniformity in the brightness and color within the surface can be provided. In particular, the display is advantageous for high quality display panels, such as televisions.

The invention claimed is:
1. A display, comprising:
a substrate;
a plurality of parallel scan wires extending over the substrate in a first direction;
a plurality of parallel data wires extending parallel to a surface of the substrate in a second direction perpendicular to the first direction;
at least one switching element per intersection between the scan wires and the data wires;
pixel electrodes connected to the switching elements;
at least one phosphor layer provided above the pixel electrodes; and
common electrodes provided above the phosphor layer,
wherein the phosphor layer has a polycrystalline structure made of a first semiconductor material and a second semiconductor material segregated between grain boundaries in the polycrystalline structure, wherein the second semiconductor material is different from the first semiconductor material.

2. The display according to claim 1, wherein the first semiconductor material and the second semiconductor material have a semiconductor structure of a different conductivity type.

3. The display according to claim 1, wherein the first semiconductor material has an n type semiconductor structure and the second semiconductor material has a p type semiconductor structure.

4. The display according to claim 1, wherein the first semiconductor material and the second semiconductor material are respectively made of a compound semiconductor.

5. The display according to claim 1, wherein the first semiconductor material is a compound semiconductor including an element in the twelfth group and an element in the sixteenth group.

6. The display according to claim 1, wherein the first semiconductor material is a compound semiconductor including an element in the thirteenth group and an element in the fifteenth group.

7. The display according to claim 1, wherein the first semiconductor material is a chalcopyrite type compound semiconductor.

8. The display according to claim 1, wherein the first semiconductor material has a cubic crystal structure.

9. The display according to claim 1, wherein the first semiconductor material includes at least one type of element selected from the group consisting of Cu, Ag, Au, Ir, Al, Ga, In, Mn, Cl, Br, I, Li, Ce, Pr, Nd, Pm, Sm, Eu, Gd, Tb, Dy, Ho, Er, Tm and Yb.

10. The display according to claim 1, wherein the average diameter of crystal grains in the polycrystalline structure made of the first semiconductor material is in a range from 5 nm to 500 nm.

11. The display according to claim 1, wherein the second semiconductor material is one of $Cu_2S$, ZnS, ZnSe, ZnSSe, ZnSeTe, ZnTe, GaN and InGaN.

12. A display, comprising:
a substrate;
a plurality of parallel scan wires extending over the substrate in a first direction;
a plurality of parallel data wires extending parallel to a surface of the substrate in a second direction perpendicular to the first direction;
at least one switching element per intersection between the scan wires and the data wires;
pixel electrodes connected to the switching elements;
common electrodes provided on the same surface of the substrate as the pixel electrodes; and
at least one phosphor layer provided above the pixel electrodes and the common electrodes,
wherein the phosphor layer has a polycrystalline structure made of a first semiconductor material and a second semiconductor material segregated between grain boundaries in the polycrystalline structure,
wherein the second semiconductor material is different from the first semiconductor material.

13. The display according to claim 12, wherein the common electrodes are approximately parallel to the scan wires or the data wires and extend in the first direction or the second direction.

14. The display according to claim 12, wherein the width of the common electrodes is different at certain intervals in a direction perpendicular to the direction in which the common electrodes extend.

15. The display according to claim 12, wherein the pixel electrodes and the common electrodes respectively have a structure in comb form and are provided so that at least portions of the structure in comb form of the pixel electrodes and the common electrodes partially interlock.

16. A display, comprising:
a substrate;
common electrodes provided on the substrate;
a dielectric layer provided over the common electrodes;
a plurality of parallel scan wires extending over the dielectric layer in a first direction;
a plurality of data wires extending parallel to a surface of the substrate in a second direction perpendicular to the first direction;
at least one switching element per intersection between the scan wires and the data wires;
pixel electrodes connected to the switching elements; and
at least one phosphor layer provided above the pixel electrodes,
wherein the phosphor layer has a polycrystalline structure made of a first semiconductor material and a second semiconductor material segregated between grain boundaries in the polycrystalline structure,
wherein the second semiconductor material is different from the first semiconductor material.

17. The display according to claim 16, wherein
the dielectric layer has at least one opening per pixel at the intersections between the scan wires and the data wires, and
the common electrodes are exposed through the openings in the dielectric layer and face the phosphor layer.

18. The display according to claim 16, wherein the common electrodes cover approximately the entire surface of the substrate.

19. The display according to claim 16, wherein the pixel electrodes and the exposed portions of the common electrodes respectively have a structure in comb form and are provided so that at least portions of the structure in comb form of the pixel electrodes and the exposed portions of the common electrodes partially interlock.

20. The display according to claim 16, further comprising a dielectric layer at least either in an interface between the pixel electrodes and the phosphor layer or in an interface between the exposed portions of the common electrodes and the phosphor layer.

21. The display according to claim 16, further comprising a color converting layer which faces the pixel electrodes and the common electrodes and is located in the front in the direction in which light is emitted.

* * * * *